(12) United States Patent
Kishi

(10) Patent No.: US 6,197,627 B1
(45) Date of Patent: Mar. 6, 2001

(54) MOS DEVICE AND METHOD OF FABRICATING THE SAME

(75) Inventor: Toshiyuki Kishi, Tokorozawa (JP)

(73) Assignee: Citizen Watch Co., Ltd., Tokyo (JP)

( * ) Notice: Subject to any disclaimer, the term of this patent is extended or adjusted under 35 U.S.C. 154(b) by 0 days.

(21) Appl. No.: 09/305,117

(22) Filed: May 4, 1999

Related U.S. Application Data

(62) Division of application No. 08/752,598, filed on Nov. 19, 1996, now Pat. No. 5,969,388.

(51) Int. Cl.[7] .......................... H01L 27/01; H01L 27/12; H01L 31/0392
(52) U.S. Cl. ............................ 438/199; 438/286; 438/289
(58) Field of Search ................................ 438/199, 286, 438/289

(56) References Cited

U.S. PATENT DOCUMENTS

| | | |
|---|---|---|
| 5,291,052 | 3/1994 | Kim et al. . |
| 5,739,574 | 4/1998 | Nakamura . |
| 5,976,938 | * 11/1999 | Gardner et al. . |
| 5,994,175 | * 11/1999 | Gardner et al. . |
| 6,020,228 | * 2/2000 | Asakura . |

FOREIGN PATENT DOCUMENTS 52-16183  2/1977  (JP) .

* cited by examiner

*Primary Examiner*—Stephen D. Meier
(74) *Attorney, Agent, or Firm*—Armstrong, Westerman, Hattori, McLeland & Naughton

(57) ABSTRACT

A MOS device comprises a p-channel semiconductor device and n-channel semiconductor device, which are formed on top of an SOI substrate consisting of a supporting substrate, an insulation film, and a semiconductor layer patterned in a plurality of islands. In the peripheral region of respective islands of the semiconductor layer, boundary films, thicker than respective gate oxide films, are formed, and a boundary film formed on the semiconductor layer for the n-channel semiconductor device is thinner than another boundary film formed on the semiconductor layer for the p-channel semiconductor device. A field doped layer 11 may be preferably provided in the peripheral region of the semiconductor layer of the n-channel semiconductor device 41. In the MOS device fabricated as above, leakage current that occurs in a parasitic MOS region in an environment under exposure to radiation is reduced, ensuring stable operation.

4 Claims, 25 Drawing Sheets

MOS DEVICE AND METHOD OF FABRICATING THE SAME

This application is a division of prior application Ser. No. 08/752,598 filed Nov. 19, 1996 now U.S. Pat. No. 5,969,388.

BACKGROUND OF THE INVENTION

1. Field of the Invention

This invention relates to a MOS device and a method of fabricating the same and, more particularly, to a MOS device of a structure suitable for use in the control system of a satellite to be launched into space and the control system of a nuclear reactor, and capable of reducing leakage current that occurs at the edges of element isolation regions isolating the elements of the MOS device when the MOS device is exposed to gamma rays or the like.

2. Description of the Prior Art

A MOS (Metal-Oxide-Semiconductor) device using a semiconductor substrate, having a semiconductor layer on top of an insulation film formed on a supporting substrate, namely, SOI (Silicon on Insulator) substrate, is well known.

The MOS device using the SOI substrate is known to have an advantage in that it can achieve complete electrical insulation and isolation among the elements, thus suppressing a latch up phenomenon.

Furthermore, the MOS device having the thin semiconductor layer formed on the insulation film is effective in preventing the short channel effect and enhancing its current driving capacity because the majority of the electric charge in the depletion layers is dominated by the potential of its gates.

Referring to FIGS. 49 and 50, the structure of a conventional MOS device is described hereafter. FIG. 50 is a plan view showing a form of such a MOS device and FIG. 49 is a cross sectional view taken on line X—X in FIG. 50.

As shown in FIG. 49, in the MOS device, an SOI substrate 4, consisting of a supporting substrate 1, an insulation film 2, and a semiconductor layer 3 patterned in a plurality of islands, is in use.

The MOS device comprises an n-channel semiconductor device 11 and a p-channel semiconductor device 12, wherein a gate oxide film 14 and a gate electrode 8 (see FIG. 50) are formed on top of a channel region 7 of respective islands of the semiconductor layer 3 formed on the SOI substrate 4. More specifically, the n-channel semiconductor device 11 is an N MOS FET (field effect transistor) and the p-channel semiconductor is a P MOS FET; both are combined to form a MOS device, constituting a complementary MOS-IC.

In the figures, only one unit of the MOS device is shown, however, a large number of the MOS devices of an identical structure (Complementary MOS-ICs) are normally formed on a single SOI substrate.

As shown in FIG. 50, each island of the semiconductor layer is provided with a source 6 and a drain 5 in regions on the opposite sides of the gate electrode 8 of the semiconductor layers 3 of the MOS device.

The respective islands of the semiconductor layer 3 formed on the SOI substrate 4 are completely insulated and isolated from each other by an interlayer dielectric film 32 formed around each of the islands of the semiconductor layer 3; interconnections 33a, 33b, and 33c, each having one end connected to the source 6, the drain 5, and the gate electrode 8, respectively, through contact holes 21 formed in the interlayer dielectric film 32, are provided; the other end of each interconnection 33a, 33b, and 33c being connected to the source 6, the drain 5, and the electrode 8, respectively, of the other MOS device formed on the same SOI substrate.

In the MOS device using the SOI substrate described as above, parasitic MOS regions 9 are formed, as shown in FIG. 49, by each island of the semiconductor layer 3; the edges of the element isolation regions, that is, the boundaries between the island of the semiconductor layer 3 and the interlayer dielectric film 32 formed around the peripheries of the islands of the semiconductor layer 3; and, the gate electrodes 8 formed over the edges of the element isolation regions.

In each of the parasitic MOS regions, a MOS structure consisting of the gate oxide film 14 and the gate electrode 8 is formed in a direction perpendicular to the channel region 7 of the n-channel semiconductor device 11 and the p-channel semiconductor device 12, respectively, on the boundary between each island of the semiconductor layer 3 and the interlayer dielectric 32.

In the parasitic MOS region, a channel is induced by an electric field of lower intensity than that for a normal channel region because, in this region, an electric field created by a normal channel region 7 (on top of the surface of the semiconductor layer 3) and an electric field created by a MOS structure formed on the sidewalls of the island of the semiconductor layer 3 are added together. As a result, a leakage current occurs.

Now, referring to FIG. 51, a conventional MOS device of an improved type so as to prevent the occurrence of leakage current in the parasitic MOS region 9 is described hereafter. FIG. 51 is a cross sectional view, similar to FIG. 49, showing the improved conventional MOS device.

In this case, a boundary region film 15, thicker than the gate oxide film 14, is formed in the peripheral regions of respective islands of the semiconductor layer 3 between respective gates 8 and respective islands of the semiconductor layer 3. By virtue of the boundary region film 15, the intensity of an electric field created in the parasitic MOS region is modulated, reducing leakage current.

Referring to FIGS. 52 and 53, the correlation between the thickness of a gate oxide film and radiation exposure dose is described.

FIGS. 52 and 53 indicate the correlation between radiation exposure dose and variation in the threshold voltage with varying thickness of the gate oxide film of a MOS device as a parameter; FIG. 52 represents the case of an n-channel semiconductor device and FIG. 53 a p-channel semiconductor device. In FIGS. 52 and 53, the horizontal axis indicates gamma ray exposure dose and the vertical axis indicates variation in the threshold voltage ($\Delta V_{th}$) caused by radiation exposure.

As is evident from these figures, as radiation exposure dose increases, so does the magnitude of variation in the threshold voltage in the case of both the n-channel semiconductor device and p-channel semiconductor device; furthermore, the thicker the gate oxide film, the more pronounced the trend of the increase in the threshold voltage becomes.

Also, it is apparent that the electric charge of the substance in the gate oxide film is of positive polarity in view of the threshold voltage shifting in the negative direction. In other words, the thicker the gate oxide film, the greater the magnitude of variation in the threshold voltage with respect to a radiation exposure dose.

Accordingly, when the MOS device of the structure as described in FIG. 51 is used as a radiation-resistant semiconductor device, the thicker the gate oxide film, the greater the positive electric charge that builds up when the device is exposed to radiation.

In the semiconductor device as shown in FIG. 51, the boundary region film 15, namely, an oxide film, for both the n-channel semiconductor device 11 and the p-channel semiconductor device 12, is formed much thicker than the gate oxide film 14 in order to modulate the intensity of the electric field created in the parasitic MOS region 9.

When this semiconductor device is exposed to radiation, positive holes of electron-hole pairs created by the radiation are trapped at the energy level of the atoms constituting the gate oxide film, causing positive electric charge to occur.

As shown in FIGS. 52 and 53, the thicker the gate oxide film, the greater the magnitude of such positive electric charge. Thus, in the semiconductor device of the structure as shown in FIG. 51, the boundary region film 15, consisting of an oxide film thicker than the gate oxide film 14, ends up having a greater positive electric charge than the gate oxide film 14.

As a result, in the n-channel semiconductor device 11, leakage current increases in the parasitic MOS region 9 because the threshold voltage of the parasitic MOS region becomes lower than for the channel region 7, although there will be no such problem encountered in the p-channel semiconductor device 12 because the threshold voltage of the parasitic MOS region becomes higher than for the channel region 7.

SUMMARY OF THE INVENTION

It is therefore an object of the invention to provide a MOS device wherein leakage current that occurs in the parasitic MOS region thereof due to exposure to radiation can be reduced, overcoming the problem as described above, and to provide a method of fabricating the same efficiently.

This invention provides a MOS device and a method of fabricating the same as described hereafter in order to achieve the abovementioned object.

The MOS device according to the invention comprises an n-channel semiconductor device and a p-channel semiconductor device formed by an SOI substrate consisting of a supporting substrate, an insulation film, a semiconductor layer patterned in a plurality of islands, a gate oxide film formed on each island of the semiconductor layer, and a gate electrode formed on the gate oxide film across the semiconductor layer.

In the p-channel semiconductor device, a first boundary film is formed in a peripheral region of each island of the semiconductor layer between the gate electrode and the semiconductor layer, and in the n-channel semiconductor device, a second boundary film, thinner than the first boundary film, is formed in the peripheral region of each island of the semiconductor layer between the gate electrode and the semiconductor layer; the first and second boundary films being thicker than the gate oxide film.

In addition, a field dope layer more heavily doped than a p-type channel doped layer may be preferably formed in the peripheral region of the island of the semiconductor layer for forming the n-channel semiconductor device.

Also, the islands of the semiconductor layer formed on the SOI may be insulated and isolated from each other by surrounding them with a field oxide film.

Further, a method of fabricating the MOS device according to the invention, comprises at least the following steps:

forming a semiconductor layer patterned in a plurality of islands for forming a n-channel semiconductor device and a p-channel semiconductor device by forming a photosensitive resin (photoresist) on the surface of the semiconductor layer formed on an SOI substrate consisting of a supporting substrate, an insulation film, and the semiconductor layer, and etching the semiconductor layer using the photosensitive resin as a mask for etching, forming a first boundary film on a surface of respective islands of the semiconductor layer by oxidizing the semiconductor layer in an oxidizing atmosphere;

removing the first boundary film from the surface of the islands of the semiconductor layer for forming the n-channel semiconductor device by etching, forming a second boundary film, thinner in thickness than the first boundary film, on the surface of the island of the semiconductor layer for forming the n-channel semiconductor device by oxidizing the semiconductor layer in an oxidizing atmosphere;

doping the island of the semiconductor layer for forming the n-channel semiconductor device with a p-type impurity for forming a channel doped layer using a photosensitive resin as a mask for ion implantation;

doping each island of the semiconductor layer for forming the p-type semiconductor device with an n-type impurity for forming a channel doped layer using a photosensitive resin as a mask for ion implantation;

forming a gate oxide film in a channel forming region of the p-channel semiconductor device and the n-channel semiconductor device, respectively, by etching the first boundary film and the second boundary film using the photosensitive resin as an etching mask such that the first boundary film and the second boundary film are left intact on a sidewall surface of respective islands of the semiconductor layer, facing boundary regions, and on a part of a top surface thereof, and by oxidizing the semiconductor layer in an oxidizing atmosphere;

forming a gate electrode for the respective semiconductor devices by forming a gate electrode material film on an entire surface of the SOI substrate including the surface of respective islands of the semiconductor layer, and by etching the gate electrode material film;

forming an n-type heavily doped layer in regions for forming a source and a drain, of each island of the semiconductor layer for forming the n-type semiconductor device using a photosensitive resin as a mask for ion implantation;

forming a p-type heavily doped layer in regions for forming a source and a drain, of each island of the semiconductor layer for forming the p-channel semiconductor device using a photosensitive resin as a mask for ion implantation;

activating impurities contained in the n-channel heavily doped layer and the p-channel heavily doped layer by applying thermal treatment;

forming an interlayer dielectric film consisting mainly of a silicon dioxide film on the entire surface of the SOI substrate;

forming a plurality of contact holes in the interlayer dielectric film by photo-etching technique; and forming interconnections with the gate electrode, the source, and the drain of the n-channel semiconductor device and the p-channel semiconductor device, respectively, through each of the contact holes.

Between the process step of doping each island of the semiconductor layer for forming the P type semiconductor device with an n-type impurity for forming a doped channel layer and the step of forming a gate oxide film, a step of forming a p-type field doped layer, more heavily doped than the channel doped layer in the peripheral region of the island of the semiconductor layer for forming the n-channel semiconductor device may be interposed.

The above and other objects, features and advantages of the invention will be apparent from the following detailed description which is to be read in conjunction with the accompanying drawings.

BRIEF DESCRIPTION OF THE DRAWINGS

FIG. 2 is a plan view and FIG. 1 is a section view taken along the line I—I of FIG. 2.

FIG. 50 is a plan view, and FIG. 49 is a section view taken along the line X—X of FIG. 50.

DETAILED DESCRIPTION OF THE PREFERRED EMBODIMENTS

Hereafter, the preferred embodiments of the invention are described in conjunction with accompanying drawings.

Figure 1:
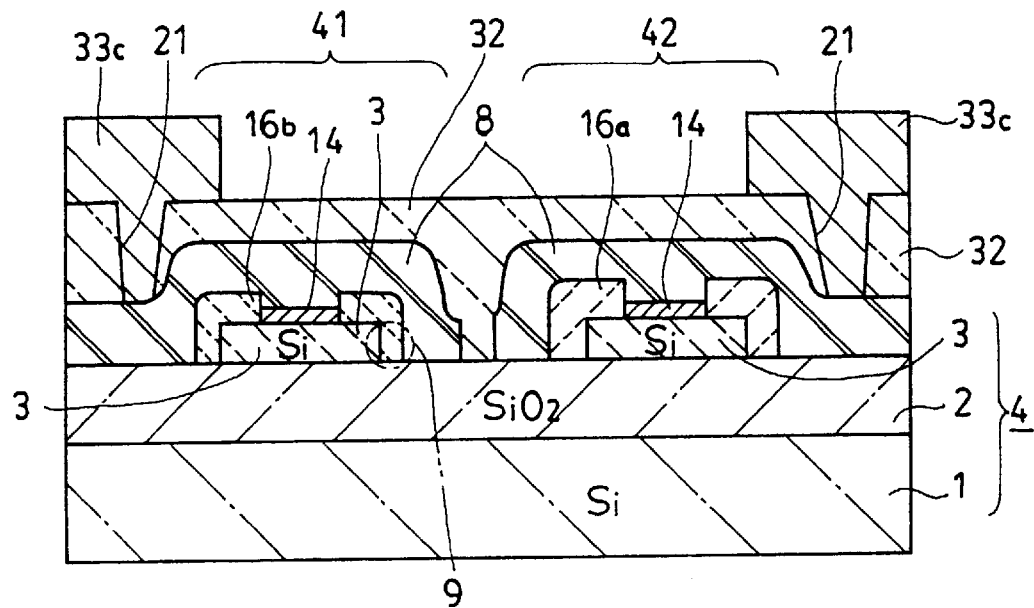
FIGS. 1 and 2 illustrate Embodiment 1 of a MOS device according to the invention.
Figure 2:
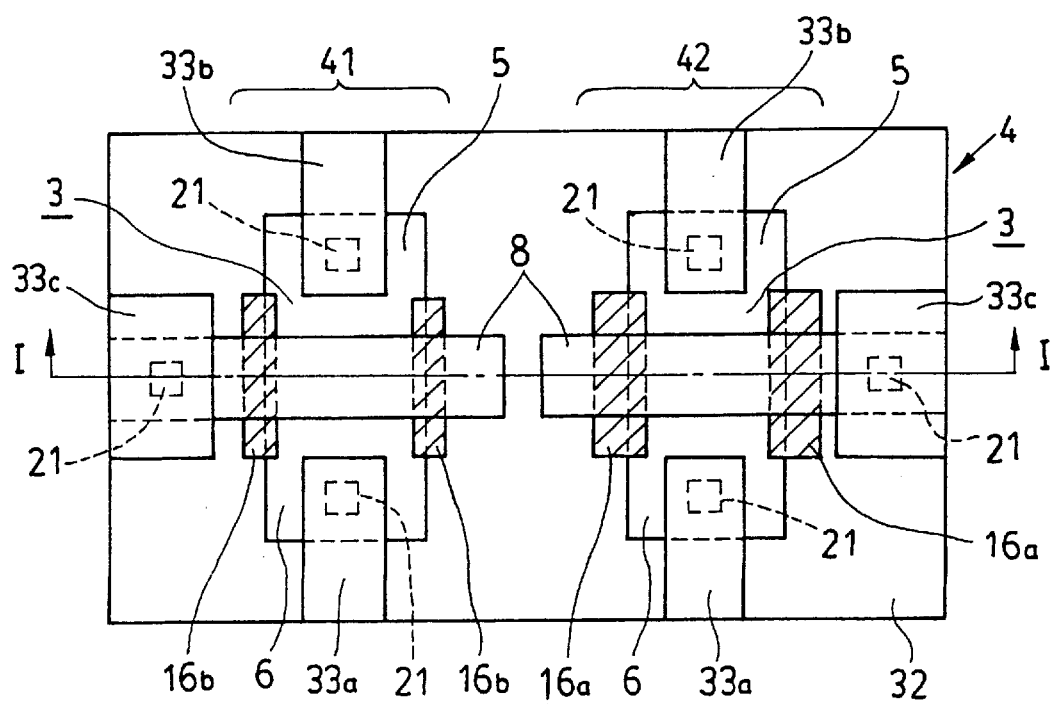

[Embodiment 1 of a MOS device: FIGS. 1 and 2]

Referring to FIGS. 1 and 2, Embodiment 1 of a MOS device according to the invention is described.

FIG. 2 is a plan view showing a plane structure of Embodiment 1 of the MOS device according to the invention, and FIG. 1 is a section view taken along the line I—I of FIG. 2

As shown in FIG. 1, the MOS device according to the invention makes use of an SOI substrate 4 consisting of a supporting substrate 1, an insulation film, and a semiconductor layer 3 patterned in a plurality of islands. The supporting substrate 1 consists of, for example, silicon (Si), the insulation film 2 consists of, for example, silicon dioxide ($SiO_2$), and the semiconductor layer 3 consists of, for example, silicon.

On the surface of the SOI substrate 4, an n-channel semiconductor device (N MOS FET) 41 and a p-channel semiconductor device (P MOS FET) 42, comprising a gate electrode 8, a gate oxide film 14, and a semiconductor layer 3, respectively, are provided, constituting a MOS device (Complementary MOS-IC).

The islands of the semiconductor layer 3 of the n-channel semiconductor device 41 and the p-channel semiconductor device 42 are completely insulated and isolated from each other by an interlayer dielectric film 32 formed around respective islands of the semiconductor layer 3.

Figure 51:
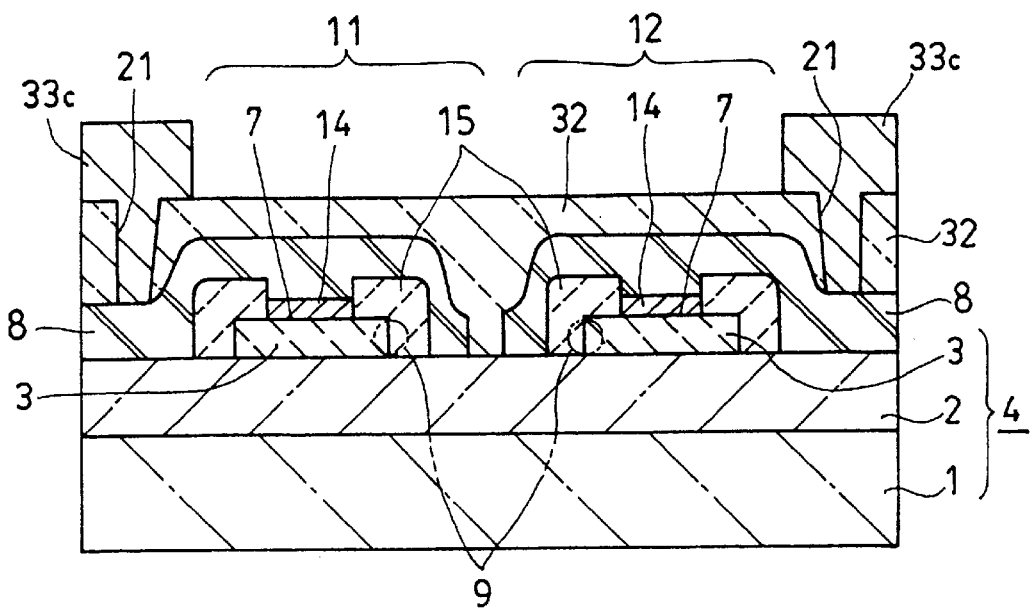
FIG. 51 is a section view, similar to FIG. 49, showing the structure of a form of an improved conventional type MOS device.
Figure 52:
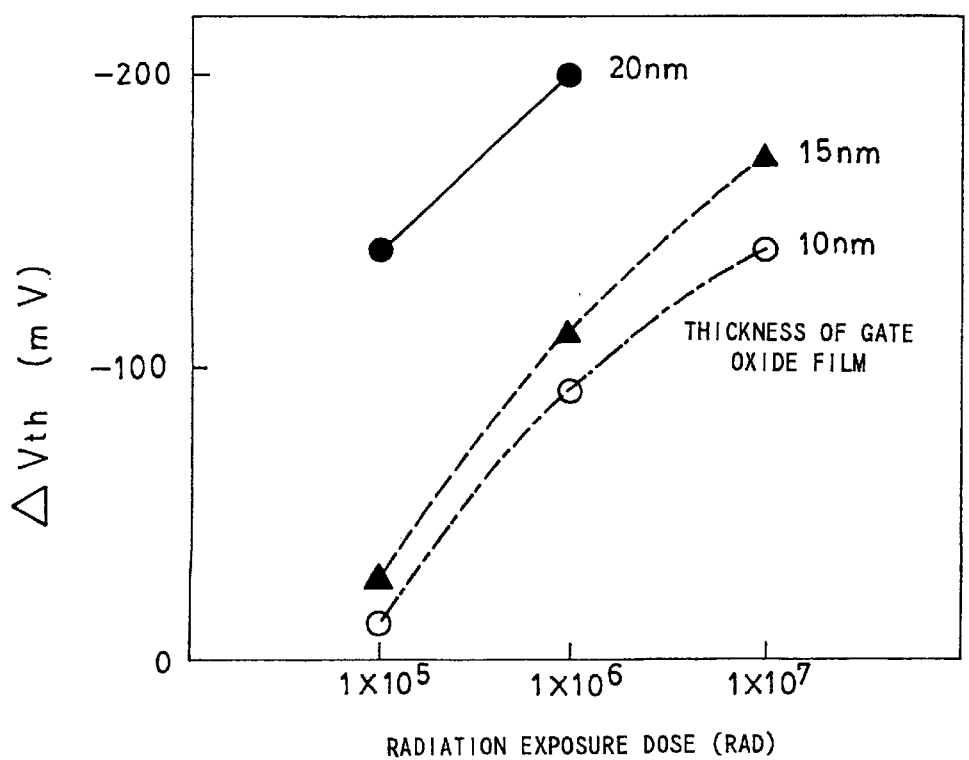
FIG. 52 is a diagram indicating the correlation between the thickness of the gate oxide film of an n-channel MOS device and a radiation exposure dose.
Figure 53:
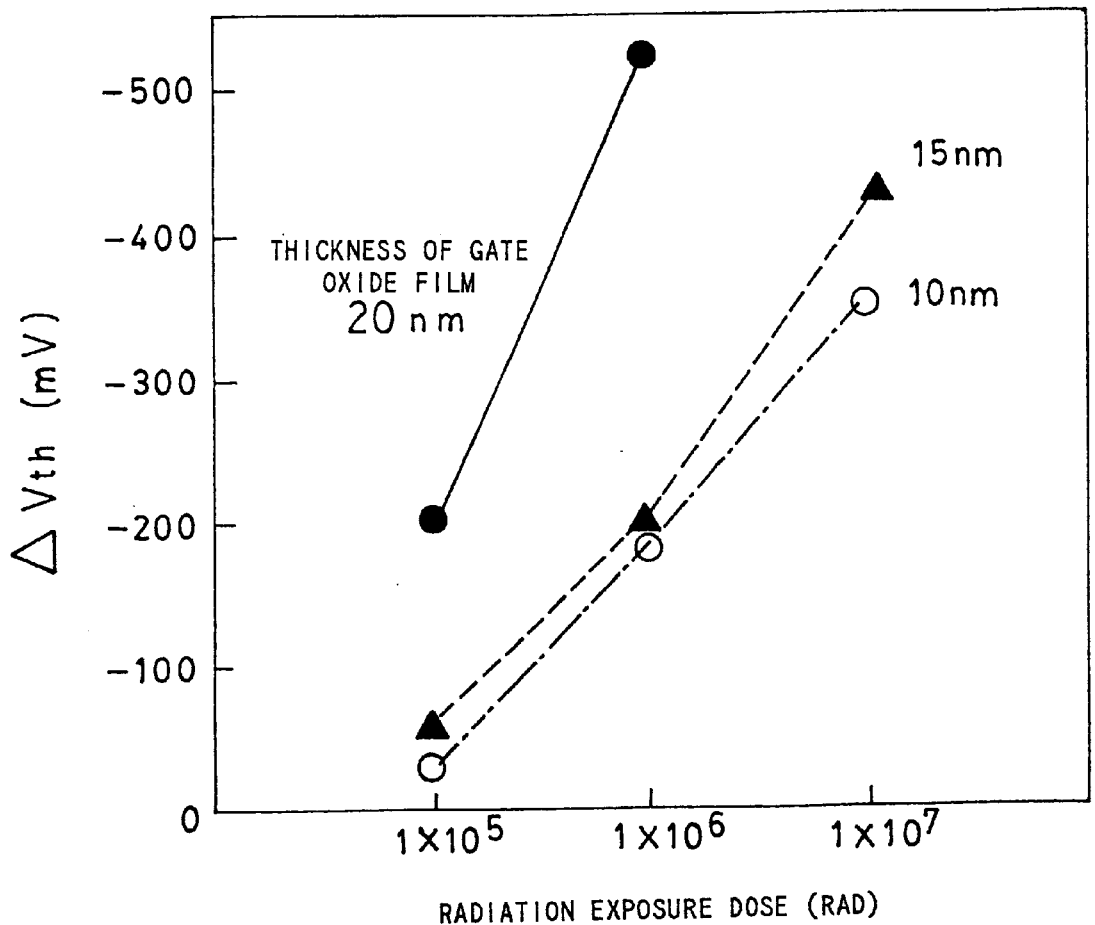
FIG. 53 is a diagram indicating the correlation between the thickness of the gate oxide film of a p-channel MOS device and a radiation exposure dose.

The structure described above is the same as that of the conventional MOS device as illustrated in FIG. 51. In this embodiment of the invention, a first boundary film 16a, which is an insulation film thicker than the gate oxide film 14, is formed in a region where the sidewall of the island of the semiconductor layer 3 of the p-channel semiconductor device 42, part of the top surface thereof, and the gate electrode 8 overlap; a second boundary film 16b, which is an insulation film thicker than the gate oxide film 14 and thinner than the first boundary film 16a, is formed in a region where the sidewall of the semiconductor layer 3 of the n-channel semiconductor device 41, part of the top surface thereof, and the gate electrode 8 overlap.

The structure described above is common to all the embodiments of a MOS device according to the invention.

The first boundary film 16a and the second boundary film 16b act together to modulate an electric field created by the gate electrode 8 of the semiconductor layer 3, suppressing the occurrence of leakage current due to a parasitic MOS structure.

Also, positive electric charge occurring in the gate oxide film due to exposure to gamma rays or the like decreases because the second boundary film 16b formed within the n-channel semiconductor device 41 is thinner than the first boundary film 16a formed within the p-channel semiconductor device 42. Thus, leakage current occurring due to positive electric charge can be suppressed.

Now, referring to FIG. 2, the plane structure of Embodiment 1 of the MOS device according to the invention is described. FIG. 2 is a plan view showing the plane pattern of the semiconductor device described above. The plane shape of the first boundary film and the second boundary film is indicated by slant lines.

As shown in FIG. 2, in the MOS device, the semiconductor layer 3 patterned in the plurality of islands and formed on the SOI substrate 4 are completely insulated and isolated from each other by the interlayer dielectric film 32.

Referring to FIG. 1, the p-channel semiconductor device 42 is provided with the gate electrode 8 on the semiconductor layer 3 via the first boundary film 16a, that is, an insulation film formed in a region where the gate oxide film 14, the semiconductor layer 3, and the gate electrode 8 overlap.

Also, the n-channel semiconductor device 41 is provided with the gate electrode 8 on the semiconductor layer 3 via the second boundary film 16b, that is, an insulation film formed in a region where the gate oxide film 14, the semiconductor layer 3, and the gate electrode 8 overlap.

As the second boundary film 16b is thicker than the gate oxide film 14 but thinner than the first boundary film 16a, the edge of the first boundary film 16a is further away from the sidewall surface of the semiconductor layer 3 of the p-channel semiconductor device 42 than the edge of the second boundary film 16b is from the sidewall of the semiconductor layer of the other semiconductor device as shown in FIG. 2.

In other words, the relation among the foregoing films is expressed by the following formula:

$$d_3 < d_2 < d_1$$

where $d_1$ is the thickness of the first boundary film 16a, $d_2$ is the thickness of the second boundary film 16b, and $d_3$ is the thickness of the gate oxide film 14. In Embodiment 1 of a MOS device according to the invention, the first and second boundary films 16a and 16b, as indicated by slanting lines in FIG. 2, are formed along the two sides, opposite to each other, of the periphery of respective islands of the semiconductor layer 3 between the gate electrode 8 and the semiconductor layer 3 of the p-channel semiconductor device 42 and the n-channel semiconductor device 41, respectively, such that the length of the respective boundary films is greater than the width of respective gate electrodes 8.

Further, a source 6 and a drain 5, which are heavily doped layers, are formed in the semiconductor layer 3 on the opposite sides of the gate electrode 8. In the n-channel semiconductor device 41, the source 6 and the drain 5 are formed in a heavily doped n region, and in the p-channel semiconductor device 42, in a heavily doped p region.

Also, interconnections 33a, 33b, and 33c are provided for connecting the source 6, the drain 5, and the gate electrode 8 of one MOS device to the source 6, the drain 5, and the electrode 8 or the like of another MOS device on the same SOI substrate via contact holes 21 formed in the interlayer dielectric film 32.

The MOS device according to the invention as shown in FIGS. 1 and 2 is operated by a flow of electric current between the drain 5 and the source 6 through a channel region formed beneath the gate electrode 8 in the same way as in the case of an ordinary MOS device.

In the MOS device according to the invention, the first boundary film 16a and the second boundary film 16b, thicker than the gate oxide film 14, are provided as insulation films in regions where the edges of an element isolation region and the electrodes 8 overlap. As a result, a gate electric field is modulated, preventing the occurrence of leakage current.

Furthermore, as the second boundary film 16b is formed to be thinner than the first boundary film 16a, positive electric charge that occurs in an insulation film due to exposure to radiation is reduced in the second boundary film 16b, and leakage current flowing in a parasitic MOS region 9 of the n-channel semiconductor device 41, caused by exposure to radiation, is decreased so that a more stable transistor performance can be achieved in an environment subjected to radiation than as for the conventional type MOS device.

Figure 3:
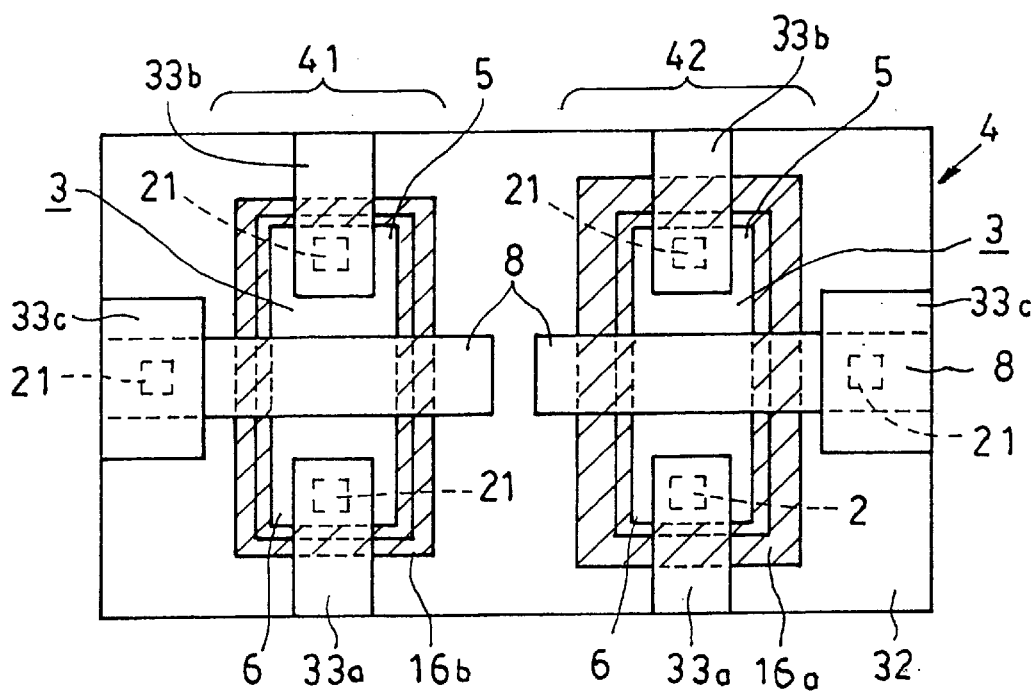
FIG. 3 is a plan view, similar to FIG. 2, illustrating Embodiment 2 of a MOS device according to the invention.

[Embodiment 2 of the MOS device: FIG. 3]

Embodiment 2 of the MOS device according to the invention is described hereafter with reference to FIG. 3.

FIG. 3 is a plan view showing a plane structure of Embodiment 2 of the MOS device according to the invention. Those parts identical with the same parts in FIG. 2 are indicated by the same reference numerals and the description thereof is omitted.

The MOS device of Embodiment 2 differs in structure from that of Embodiment 1 only in that the first boundary film 16a and the second boundary film 16b are formed in regions surrounding the entire periphery of respective islands of the semiconductor layer 3 for the n-channel semiconductor device 41 and the p-channel semiconductor device 42, as indicated by slant lines in FIG. 3.

Accordingly, this MOS device is provided with the first boundary film 16a and the second boundary film 16b in regions where the interconnections 33a and 33b and the edges of respective islands of the semiconductor layer 3 overlap. Therefore, the level of a step on the edges of the semiconductor layer 3 is lowered in comparison with the case of Embodiment 1 to provide better step covering for the interlayer dielectric film 32, interconnections 33a and 33b.

Other aspects including the constitution, operation, and effect of Embodiment 2 being the same as for the aforesaid Embodiment 1, the description thereof is omitted.

Figure 4:
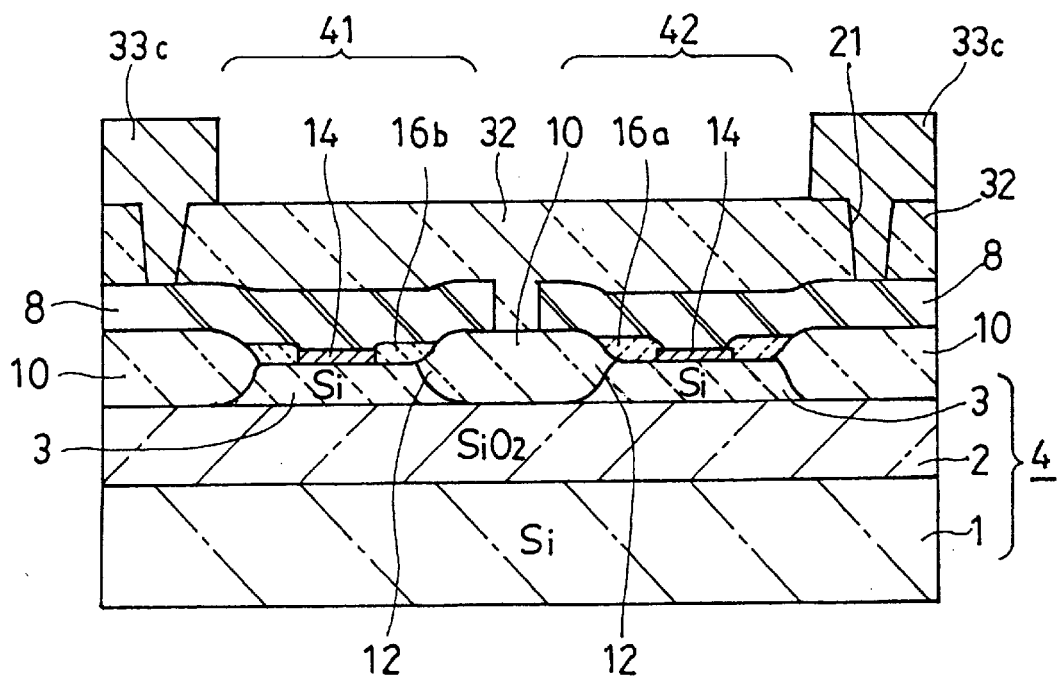
FIG. 4 is a section view, similar to FIG. 1, illustrating Embodiment 3 of a MOS device according to the invention.

[Embodiment 3 of the MOS device: FIG. 4]

Embodiment 3 of the MOS device according to the invention is described hereafter with reference to FIG. 4.

FIG. 4 is a section view, similar to FIG. 1, showing a sectional structure of Embodiment 3 of the MOS device according to the invention. Those parts identical with the same parts in FIG. 1 are indicated by the same reference numerals.

In Embodiment 3, an SOI substrate 4 consisting of a supporting substrate 1, an insulation film 2, and a semiconductor layer 3 is used, and respective islands of the semiconductor layer 3 are insulated and isolated from each other by a field oxide film 10. The field oxide film 10 is formed by means of a local oxidation of silicon (LOCOS process).

The MOS device of Embodiment 3 also comprises an n-channel semiconductor device 41 and a p-channel semiconductor device 42. A first boundary film 16a, that is, an insulation film thicker than a gate oxide film 14, is formed in a region where a part of the top surface of each semiconductor layer 3 of the p-channel semiconductor device 42 and a gate electrode 8 overlap. Also, a second boundary film 16b, that is, an insulation film thinner than the first boundary film 16a, is formed in a region where part of the top surface of the semiconductor layer 3 of the n-channel semiconductor device 41 and a gate electrode 8 overlap.

The first boundary film 16a and the second boundary film 16b are effective in modulating an electric field created by the gate electrode 8 of each semiconductor layer 3, thus suppressing leakage current due to a parasitic MOS structure.

In addition, the magnitude of positive electric charge that occurs in the oxide film due to exposure to radiation is decreased because the second boundary film 16b formed within the n-channel semiconductor device is thinner than the first boundary film 16a, suppressing leakage current due to positive electric charge.

In the MOS device wherein the islands of the semiconductor layer 3 are insulated and isolated from each other by the field oxide film 10, the field oxide film 10 takes the shape of the beak of a bird in cross section at its boundary with the semiconductor layer 3; hence this region is called a bird's beak 12. In the n-channel semiconductor device 41, boron dopant contained in the semiconductor layer 3 is diffused into the oxide film at the time of local oxidation for LOCOS isolation, and the dopant concentration in the semiconductor layer 3 becomes lower, particularly in a region close to the bird's beak 12. Consequently, a parasitic MOS is formed in this region, creating a cause for leakage current.

However, in the MOS device of Embodiment 3, the second boundary film 16b, which is an insulation film thicker than the gate oxide film 14, is formed on top of the bird's beak 12 of the n-channel semiconductor device 41. As a result, the electric field created by the gate electrode 8 is modulated, preventing the occurrence of leakage current.

The first boundary film 16a and the second boundary film 16b are formed, in the same manner as in Embodiment 1 as shown in FIG. 2, along the two sides, opposite to each other, of the periphery of respective islands of the semiconductor layer 3 between the gate electrode 8 and the semiconductor layer 3 of the p-channel semiconductor device 42 and the n-channel semiconductor device 41, respectively, such that the length of both the first boundary film 16a and the second boundary film 16b is greater than the width of respective gate electrodes 8.

Otherwise, in the same manner as in Embodiment 2 as shown in FIG. 3, the first boundary film 16a and the second boundary film 16b may be formed along the entire periphery of respective islands of the semiconductor layer 3 between the gate electrode 8 and the semiconductor layer 3 of the p-channel semiconductor device 42 and the n-channel semiconductor device 41, respectively.

Other aspects including the constitution, operation, and effect of Embodiment 3 being the same as for the aforesaid Embodiment 1, the description thereof is omitted.

Figure 5:
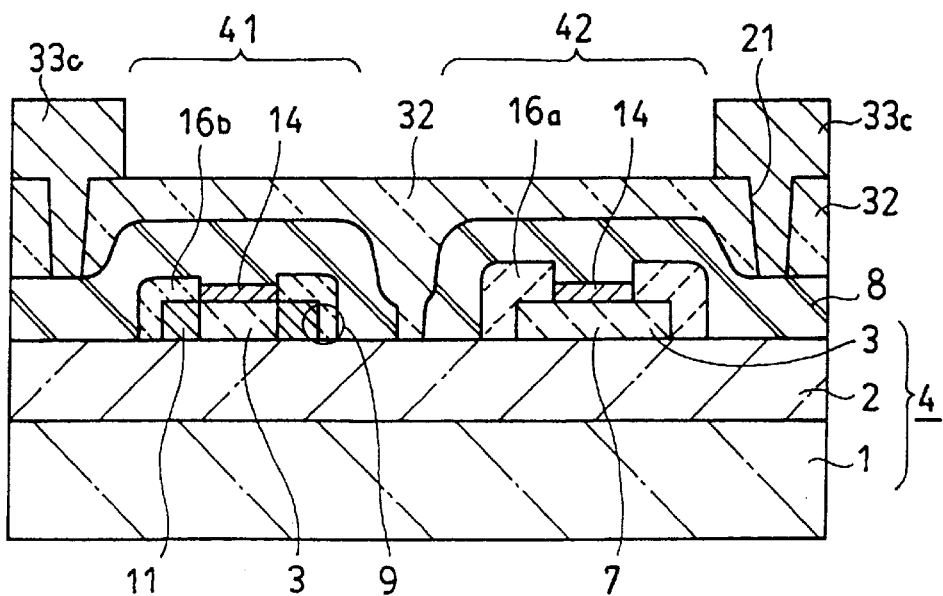
FIG. 5 is a section view, similar to FIG. 1, illustrating Embodiment 4 of a MOS device according to the invention.

[Embodiment 4 of the MOS device: FIG. 5]

Embodiment 4 of the MOS device according to the invention is described hereafter with reference to FIG. 5.

FIG. 5 is a section view, similar to FIG. 1, showing a sectional structure of Embodiment 4 of the MOS device according to the invention. Those parts identical with the same parts in FIG. 1 are indicated by the same reference numerals.

The MOS device of Embodiment 4 is similar in structure to the MOS device of Embodiment 1 as illustrated in FIGS. 1 and 2 except that a field dope layer 11, more heavily doped than a p-type channel doped layer of the semiconductor layer 3, is formed in a region around the periphery of the semiconductor layer 3 of the n-channel semiconductor device 41.

As an impurity concentration of the field dope layer 11 is higher than that of the p-type channel doped layer, the threshold voltage in a parasitic MOS region 9 is caused to rise, thus enabling more effective suppression of leakage current that occurs due to the parasitic MOS structure.

Even in the case that positive electric charge is created in the oxide films (particularly, in the second boundary film 16b) of the n-channel semiconductor device 41 as a result of exposure to radiation, an inversion layer induced by the positive electric charge is not formed in the semiconductor layer 3 because of the higher threshold voltage of the parasitic MOS region 9, which is achieved by virtue of the field dope layer 11 formed in a region around the periphery of the semiconductor layer 3. Thus, leakage current due to the positive electric charge can be effectively suppressed.

In this connection, in the MOS device of Embodiment 2 as shown in FIG. 3 or of Embodiment 3 as shown in FIG. 4, it is possible to suppress more effectively leakage current due to the parasitic MOS structure by forming the field doped layer 11 in a region around the periphery of the semiconductor layer 3 of the n-channel semiconductor device 41.

Figure 6:
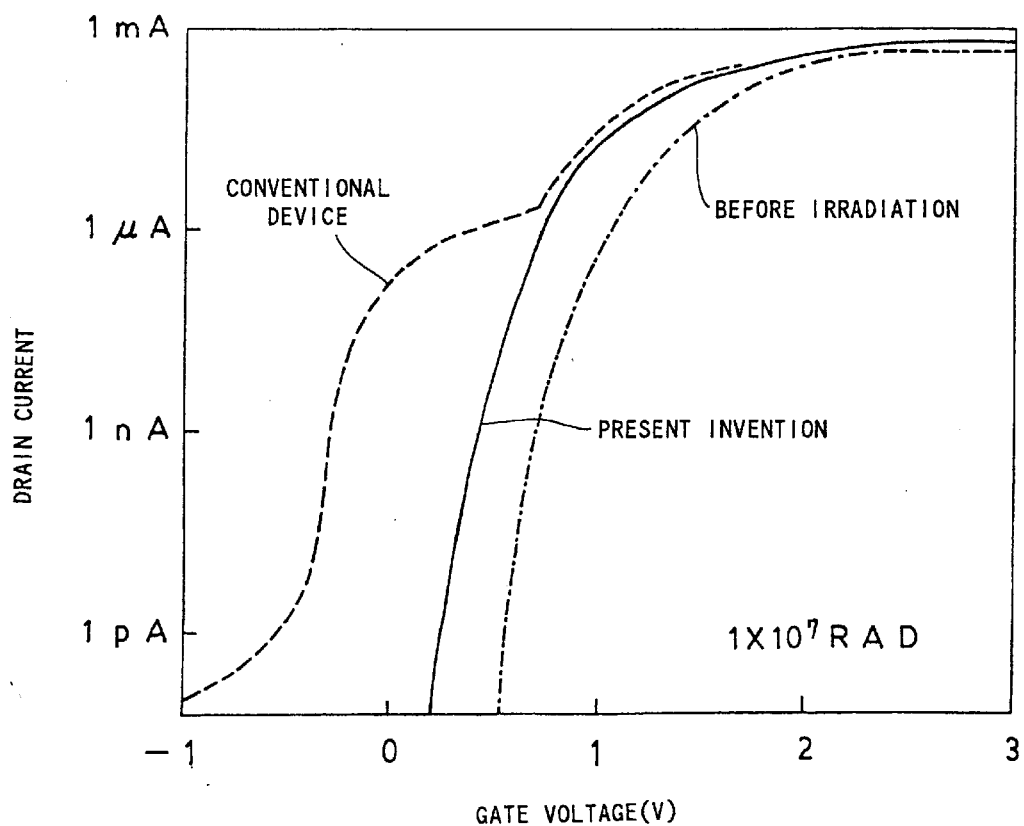
FIG. 6 is a diagram showing the characteristic of a MOS device according to the invention under exposure to radiation in comparison with a conventional semiconductor device.
Figure 49:
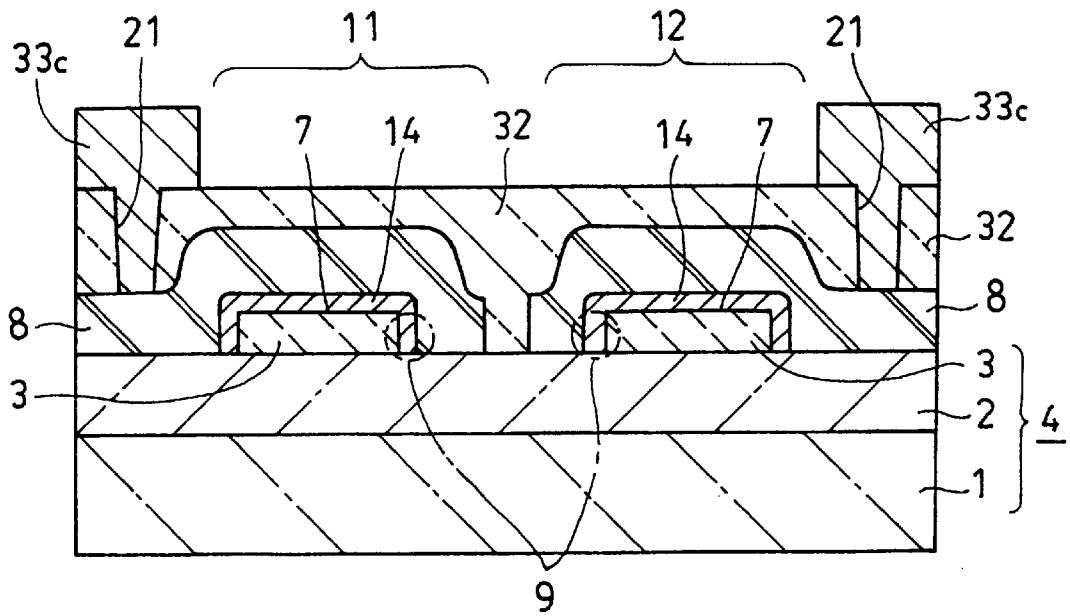
FIGS. 49 and 50 show the structure of a form of the conventional MOS semiconductor device.
Figure 50:
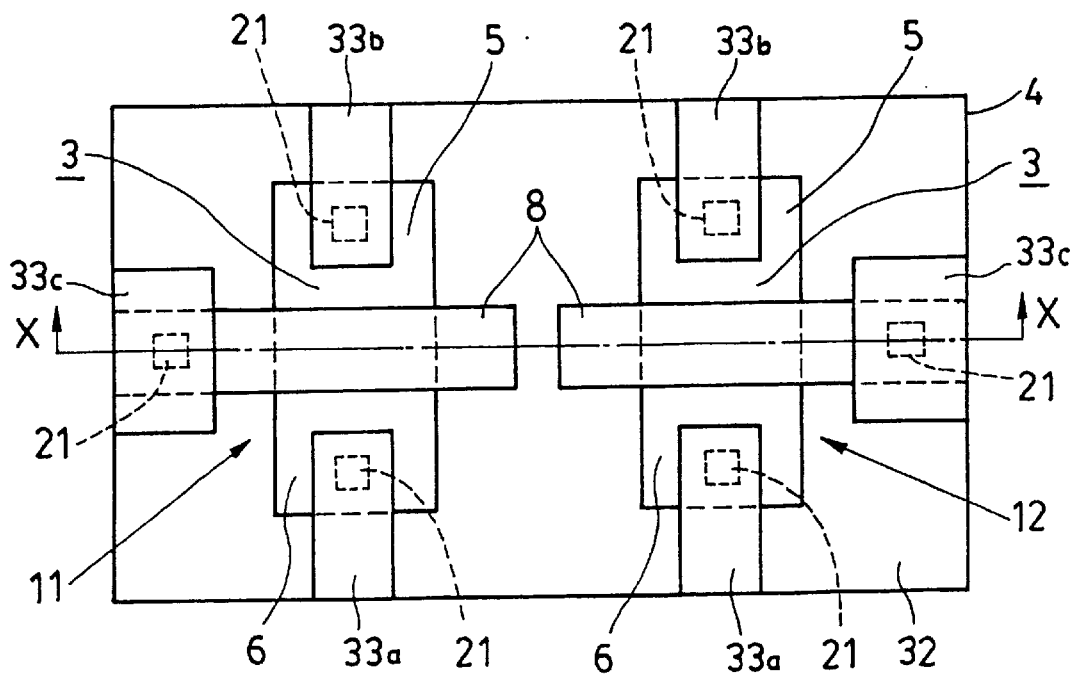

Now, referring to FIG. 6, the characteristics of the MOS device according to the invention when it is used under exposure to radiation is described. FIG. 6 is a diagram showing gate electrode vs. drain current characteristics before and after irradiation with reference to the n-channel semiconductor device 41 (referred to as "this invention") of Embodiment 4 of the MOS device according to the invention, and the n-channel semiconductor device 11 (referred to as "a conventional device") of a conventional MOS device as shown in FIG. 49.

In FIG. 6, the horizontal axis represents the gate voltage, and the vertical axis the drain current, expressed as a logarithm. The dashed and dotted line indicates a curve for the characteristic of both this invention and a conventional device, before irradiation.

The broken line indicates a curve for the characteristic of a conventional device after irradiation of $1 \times 10^7$ RAD, showing that there is a large increase in the drain current value in the low gate voltage zone. Therefore, it is apparent that an increase in leakage current has occurred.

The solid line indicates a cue for the characteristic of this invention after irradiation of $1 \times 10^7$ RAD, showing little change in the shape of the curve between before and after irradiation, although some shifting of the curve has occurred. It is apparent therefore that leakage current has not occurred in this case. Some shifting of the curve is attributable to positive electric charge created in the gate oxide film.

As described in the foregoing, the MOS device according to the invention can be operated with its characteristics only slightly affected in an environment subjected to exposure to radiation, giving a stable performance.

The same applies to not only Embodiment 4 but also to all preferred embodiments described above of the MOS device according to the invention.

[Embodiment 1 of the method of fabricating a MOS device: FIGS. 7 to 24]

The preferred embodiments of the method of fabricating a MOS device, according to the invention, are described hereafter.

Referring to FIGS. 7 to 24 showing cross section views at respective processing steps for the fabrication of a MOS device, and also FIGS. 1 and 2, Embodiment 1 of the method of fabricating the MOS device as shown in FIGS. 1 and 2 (Embodiment 1 of the MOS device) is described. In FIGS. 7 to 24, parts corresponding to the same parts in FIGS. 1 and 2 are indicated by the identical reference numerals.

Figure 7:
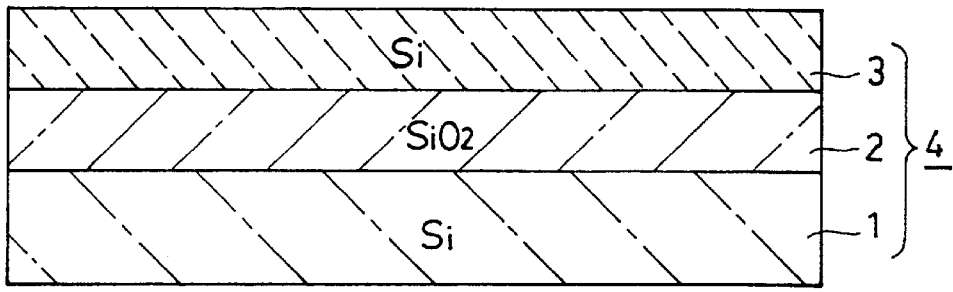
FIGS. 7 to 24 are section views of the semiconductor device in respective steps of processing, illustrating Embodiment 1 of a method of fabricating a MOS device, according to the invention.

In fabricating the MOS device as shown in FIGS. 1 and 2, a so-called SOI substrate 4, that is a laminated substrate, consisting of a supporting substrate 1 made of silicon (Si), an insulation film 2 made of silicon dioxide ($SiO_2$) formed to a thickness of 80 nm on top of the supporting substrate 1, and an n-type semiconductor layer 3 made of silicon formed to a thickness of 180 nm on top of the insulation film 2 is formed as shown in FIG. 7. However, for convenience of illustration, the insulation film 2 and the semiconductor layer 3 are shown as if they had a similar thickness in the figure.

Figure 8:
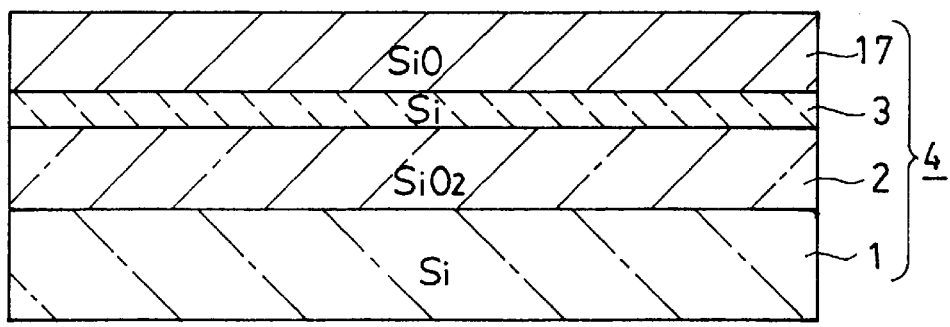

As shown in FIG. 8, an oxide film 17 of silicon oxide (SiO) is formed to a thickness of 180 nm by oxidizing the semiconductor layer 3 on top of the SOI substrate 4. The oxide film 17 is formed by applying an oxidation treatment in a water vapor atmosphere at 950° C. for 40 minutes.

Figure 9:
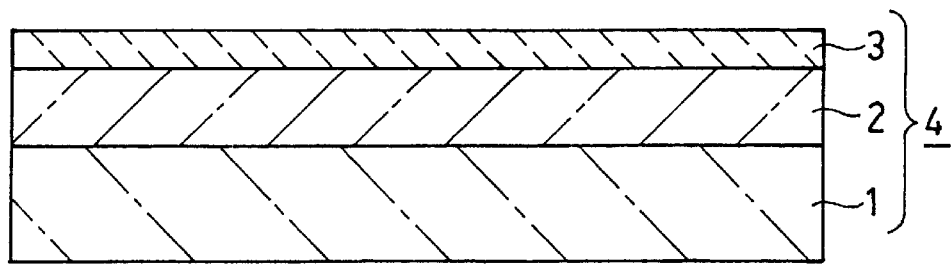

Then, as shown in FIG. 9, the entire surface of the oxide film 17 is etched by a wet etching process using hydrofluoric acid containing HF as an etchant, reducing the thickness of the semiconductor layer 3 to 90 nm.

However, the step of forming the oxide film 17 and then reducing the thickness of the semiconductor layer 3 by etching the entire surface of the oxide film 17 varies depending upon the thickness of the semiconductor layer 3 on the SOI substrate 4 and the set thickness thereof after reduction of the thickness by the aforesaid process. This step is not necessarily required as long as the thickness of the semiconductor layer 3 is 90 nm when it is put to use.

Besides the step of reducing the thickness of the semiconductor layer 3 by oxidizing the same first and then by etching an oxide film thus formed, there is another step of etching the semiconductor layer 3 by use of a mixed solution containing nitric acid and hydrofluoric acid.

Figure 10:
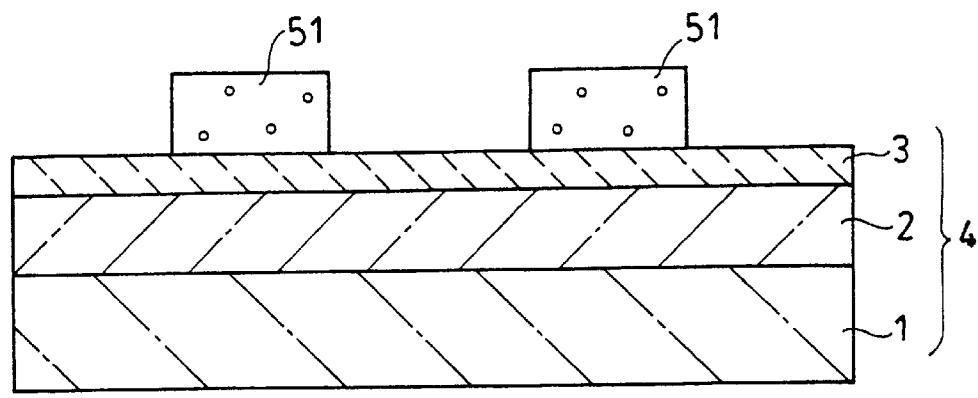

In the next step, a photosensitive resin is applied to the entire surface of the SOI substrate 4 by means of a spinner (a machine that applies a drop of photosensitive resin and, by spinning the wafer under controlled velocity and accelleration, spreads the photosensitive resin into a nearly uniform layer), and a pattern is formed on a photosensitive resin by the photolithographic technique using a predetermined photo mask; thereby forming, as shown in FIG. 10, photosensitive resin 51 in predetermined regions (where the photosensitive resin, each in the shape of an island, are left intact) on the semiconductor layer 3.

Thereafter, using the photosensitive resin 51 as etching masks, the semiconductor layer 3 is completely etched dowm to the surface of the insulation film 2. The etching of the semiconductor layer 3 is carried out by means of the reactive ion etching, using a mixed gas containing sulfur hexafluoride ($SF_6$), helium (He), and oxygen ($O_2$) as an etching gas.

Figure 11:
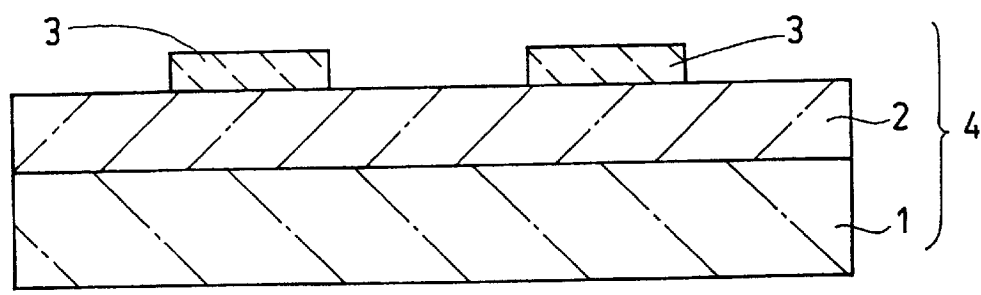

After the etching of the semiconductor layer 3, the photosensitive resins 51 are removed; thereby, as shown in FIG. 11, the semiconductor layer 3 patterned in a plurality of islands, for forming a MOS device, is formed.

Figure 12:
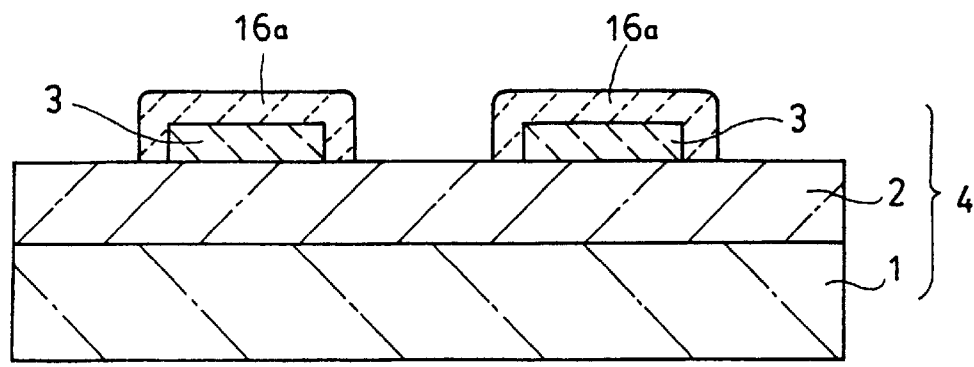

Then, as shown in FIG. 12, the semiconductor layer 3 is oxidized, and a first boundary film 16a, consisting of silicon oxide, is formed to a thickness of 20 nm (in the figure, the thickness is shown exaggerated for convenience of illustration). The first boundary film 16a is formed by applying an oxidation treatment in an atmosphere of a mixed gas containing oxygen and nitrogen at 1000°°C. for 25 minutes.

Figure 13:
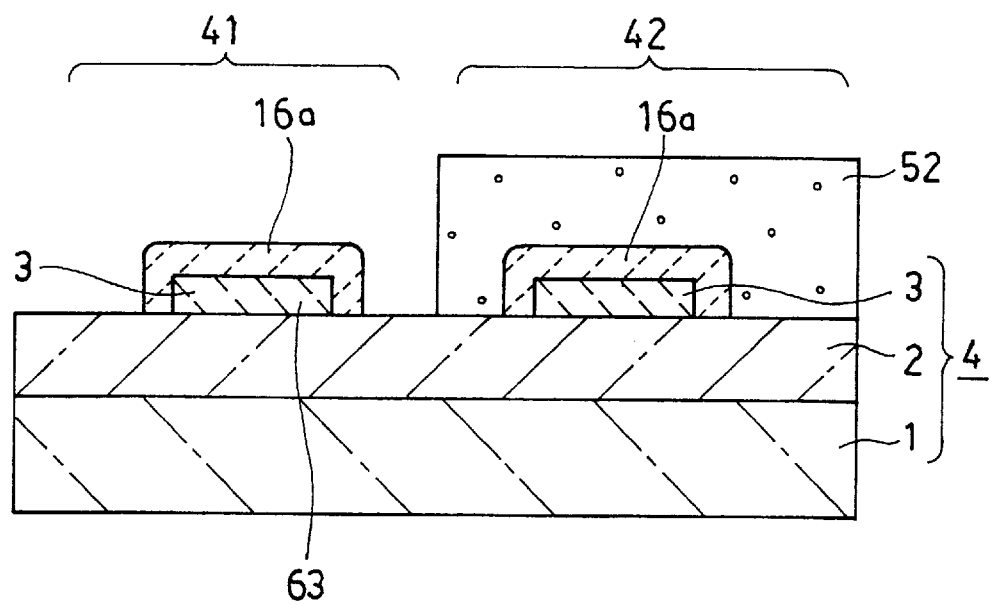

Subsequently, a photosensitive resin is applied to the entire surface of the SOI substrate 4 by means of the spinner, and a pattern is formed on a photosensitive resin 52 by the photolithographic techniques using a predetermined photo mask such that the photosensitive resin 52 has openings in a region covering the island of the semiconductor layer 3 on which a n-channel semiconductor device 41 is to be formed and the peripheral region thereof as shown in FIG. 13.

Using the photosensitive resin 52 as a mask for ion implantation, a p-type channel doped layer 63 is formed by introducing boron (B), that is, a p-type dopant for controlling the threshold voltage, into the semiconductor layer 3 in a region where an n-channel semiconductor device 41 is to be formed.

The dose of ions of boron implanted for forming the p-type channel doped layer 63 is in the order of $3 \times 10^{12}$ $cm^{-2}$, and ion implantation is carried out with an ion implantation energy at 25 keV. Thereafter, the photosensitive resin 52 used as the mask for ion implantation is removed.

Figure 14:
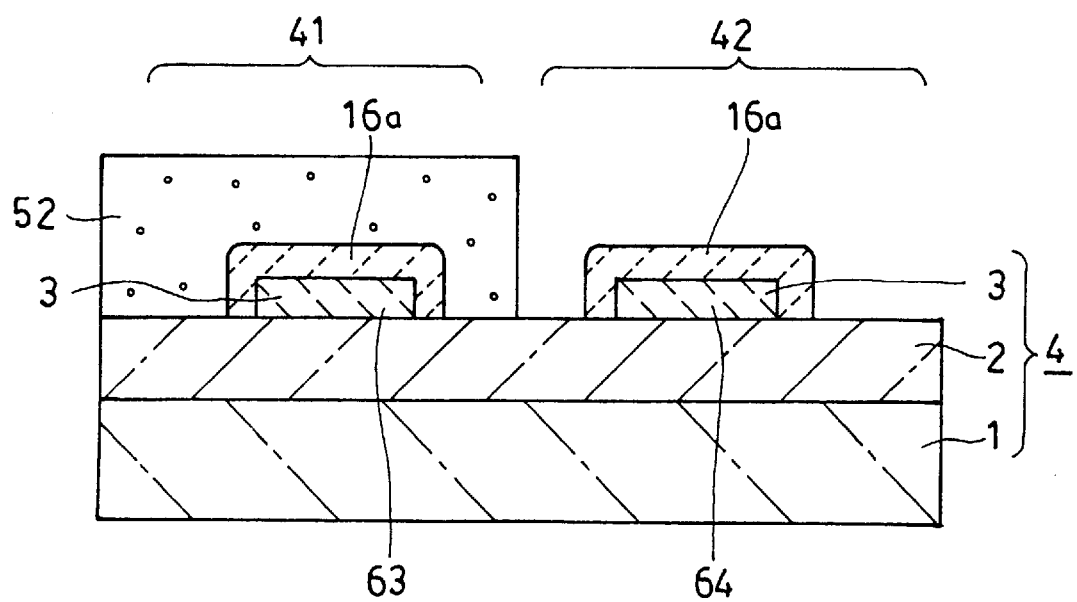

Then, again, a photosensitive resin is applied to the entire surface of the SOI substrate 4 by means of the spinner, and a pattern is formed on a photosensitive resin 52 by the photolithographic techniques using a predetermined photo mask such that the photosensitive resin 52 has openings in a region covering the island of the semiconductor layer 3 on which a p-channel semiconductor device 42 is to be formed and the peripheral region thereof as shown in FIG. 14.

Using the photosensitive resin 52 as a mask for ion implantation, an n-type channel doped layer 64 is formed by introducing phosphorus (P), that is, an n-type dopant, into the semiconductor layer 3 in a region where a p-channel semiconductor device 42 is to be formed.

The dose of ions of phosphorus implanted for forming the n-type channel doped layer 64 is in the order of $2 \times 10^{12}$ $cm^{-2}$, and ion implantation is carried out with an ion implantation energy at 30 keV. Thereafter, the photosensitive resin 52 used as the mask for ion implantation is removed.

Subsequently, a photosensitive resin is again applied to the entire surface of the SOI substrate 4 by means of the spinner, and a pattern is formed on a photosensitive resin 52 by the photolithographic techniques using a predetermined photo mask such that the photosensitive resin 52 has openings in a region covering the island of the semiconductor layer 3 on which an n-channel semiconductor device 41 is to be formed, and the peripheral region thereof in the same manner as shown in FIG. 13.

Figure 15:
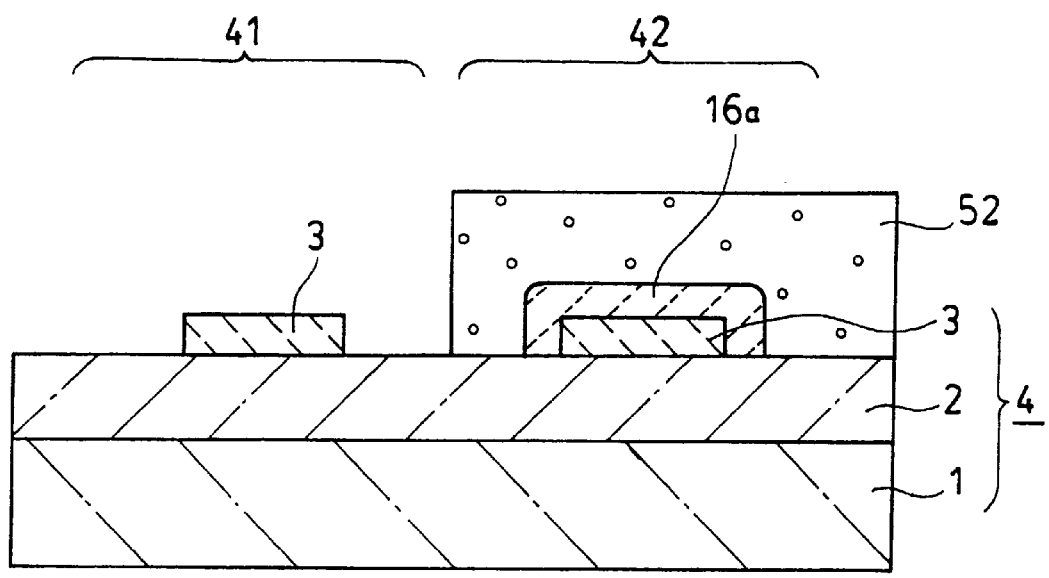

In the next step, the first boundary film 16a formed on top of the semiconductor layer 3 in a region where the n-channel semiconductor device 41 is to be formed, is removed by the etching process, as shown in FIG. 15, using the photosensitive resin 52 as an etching mask. The etching process is applied to the first boundary film 16a using hydrofluoric acid containing HF. Thereafter, the photosensitive resin 52 is removed.

Figure 16:
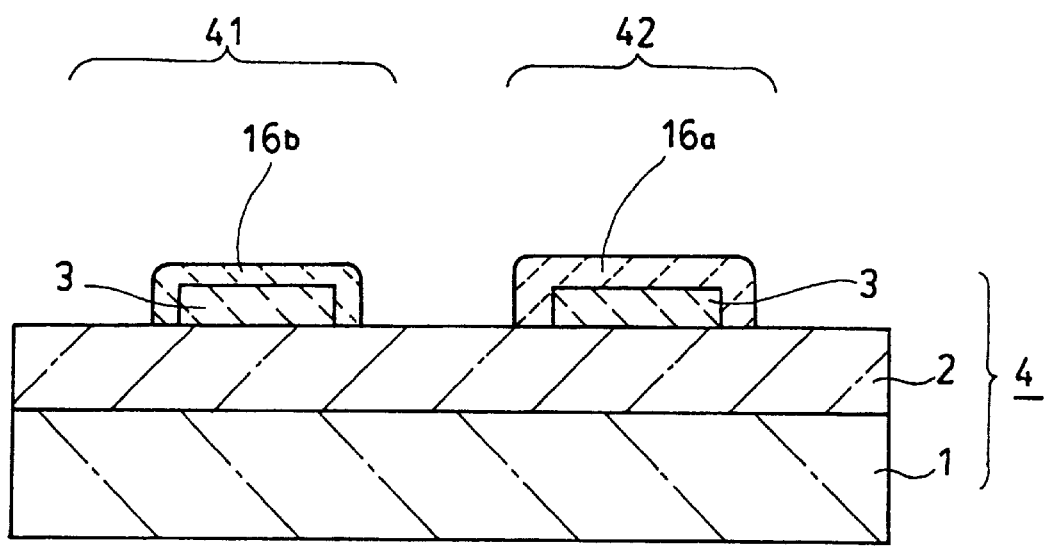

Then, as shown in FIG. 16, a second boundary film 16b consisting of silicon oxide is formed to a thickness of 15 nm on the surface of the semiconductor layer 3 by oxidizing the semiconductor layer 3 in the form of islands on top of the SOI substrate 4. The second boundary film 16b is formed by applying an oxidation treatment in an atmosphere of a mixed gas containing oxygen and nitrogen at 1000° C. for 25 minutes.

The second boundary film 16b is formed on the surface of the semiconductor layer 3 in the region where the n-channel semiconductor device 41 is to be formed, and is also formed, to a lesser extent on the semiconductor layer 3 in the region where the p-channel semiconductor device 42 is to be formed. However, the resultant increase in the thickness is minimal in this region because of the presence of the first boundary film 16a.

Figure 17:
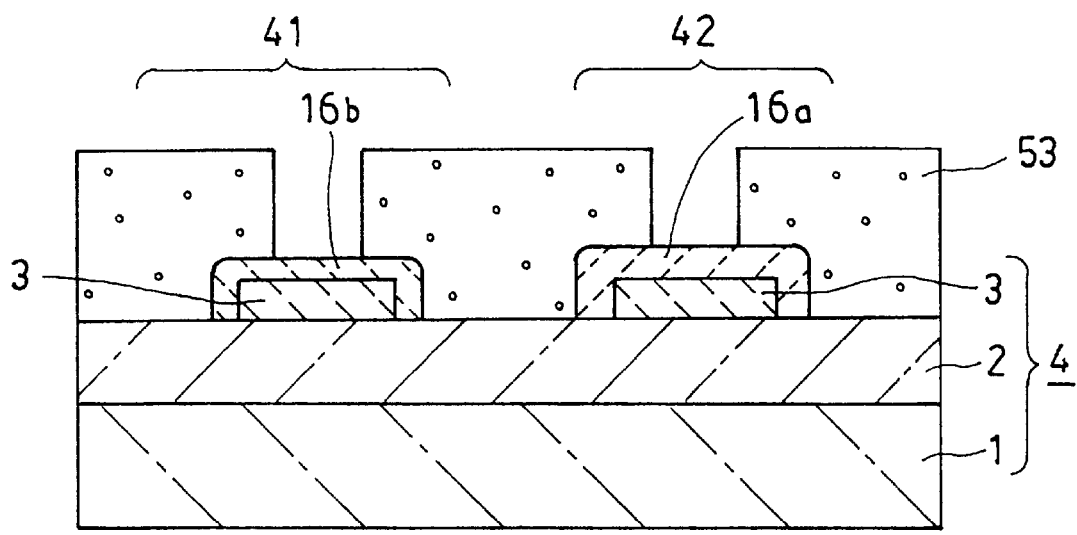

Then, a photosensitive resin is applied to the entire surface of the SOI substrate 4 by means of roll coating, and a pattern is formed on a photosensitive resin such that the photosensitive resin 53 has openings in channel forming regions on the surface of the semiconductor layer 3 as shown in FIG. 17, and the first boundary film 16a and the second boundary film 16b are formed in a manner as shown in a plan view of FIG. 2.

At this time, the pattern is formed on the photosensitive resin 53 such that the first boundary film 16a and the second boundary film 16b are left intact, up to 0.6 μm from the edges of the respective islands of semiconductor layer 3 toward element isolation regions and longer by 1 μm than the channel length of the respective gate electrodes 8 as shown in FIGS. 1 and 2.

Using the photosensitive resin 53 as an etching mask, the first boundary film 16a and the second boundary film 16b in channel forming regions are etched by hydrofluoric acid containing HF.

Figure 18:
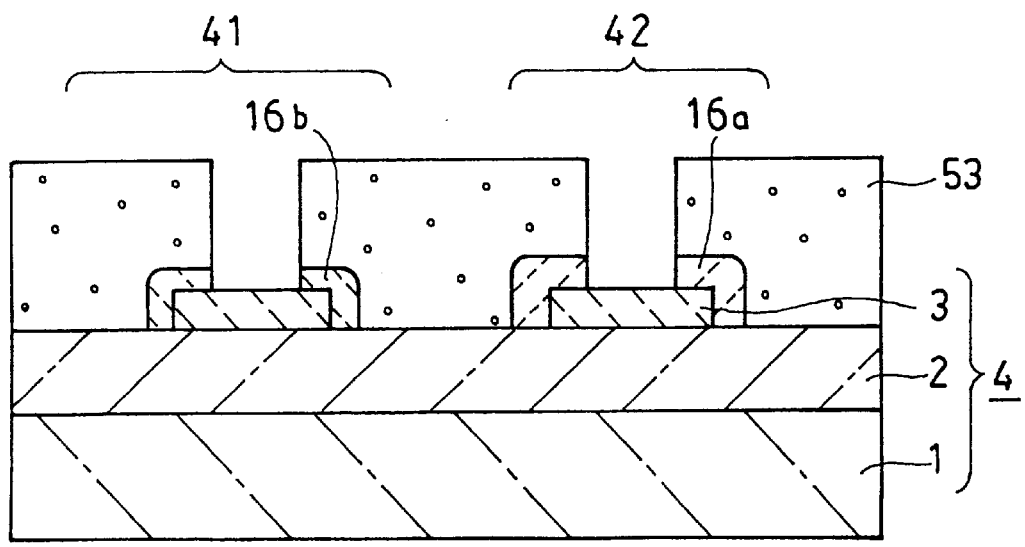

As shown in FIG. 18, by the etching process applied as above, the first boundary film 16a can be formed inside the device isolation regions up to 0.6 μm from the edges of the island of the semiconductor layer 3 for forming the p-channel semiconductor device 42, and the second boundary film 16b can be formed inside the device isolation regions up to 0.6 μm from the edges of the island of the semiconductor layer 3 for forming the n-channel semiconductor device 41. Thereafter, the photosensitive resin 53 is removed.

Figure 19:
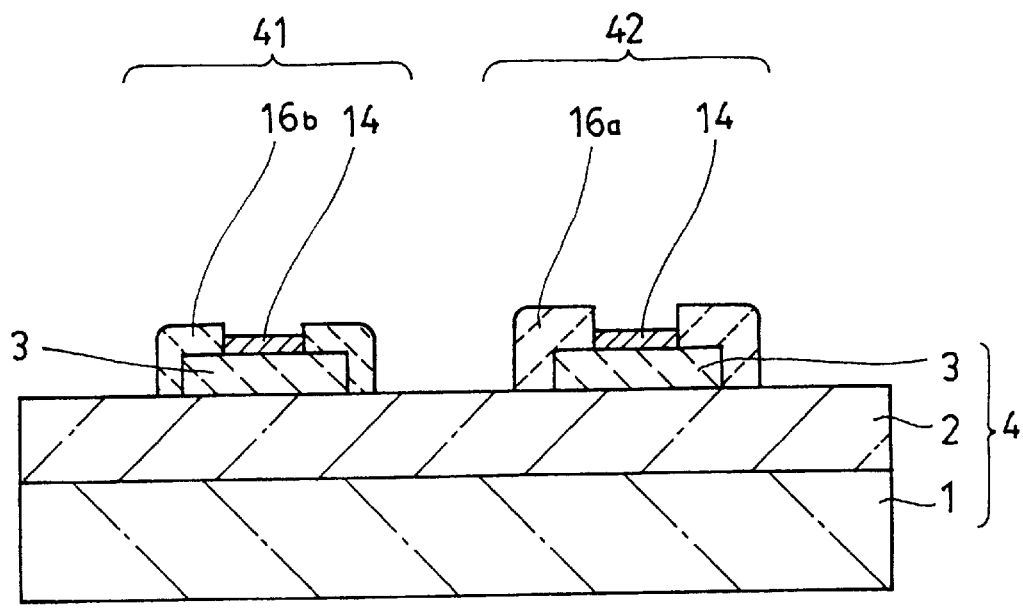

As shown in FIG. 19, the islands of the semiconductor layer 3 are oxidized, and a gate oxide film 14 consisting of silicon oxide is formed to a thickness of 10 nm on each of the islands. The gate oxide films 14 are formed by applying the oxidation process in an oxygen atmosphere at 900° C. for 25 minutes.

When the gate oxide films 14 are formed on the respective islands of the semiconductor layer 3 in the area where the first boundary film 16a or the second boundary film 16b is removed by etching (channel forming region), an oxide film is formed slightly in other areas as well, however, an increase in the thickness due to the oxidation treatment is minimal owing to the presence of the first and second boundary films, 16a and 16b, respectively, which are oxide films.

Figure 20:
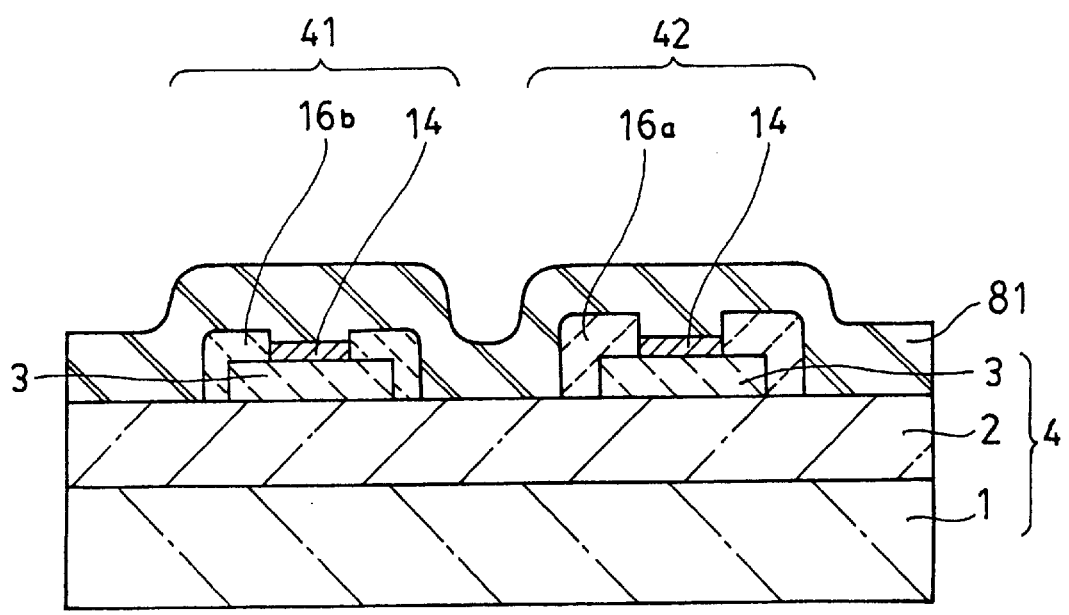

As shown in FIG. 20, a gate electrode material 81 consisting of a polycrystalline silicon 400 nm thick is then formed on the entire surface of the SOI substrate 4 by means of the chemical vapor deposition method using mono silane ($SiH_4$) as reactive gas. In FIG. 20, for convenience of illustration, the gate electrode material 81 and the insulation film 2 are shown as if they were of a similar thickness.

Figure 21:
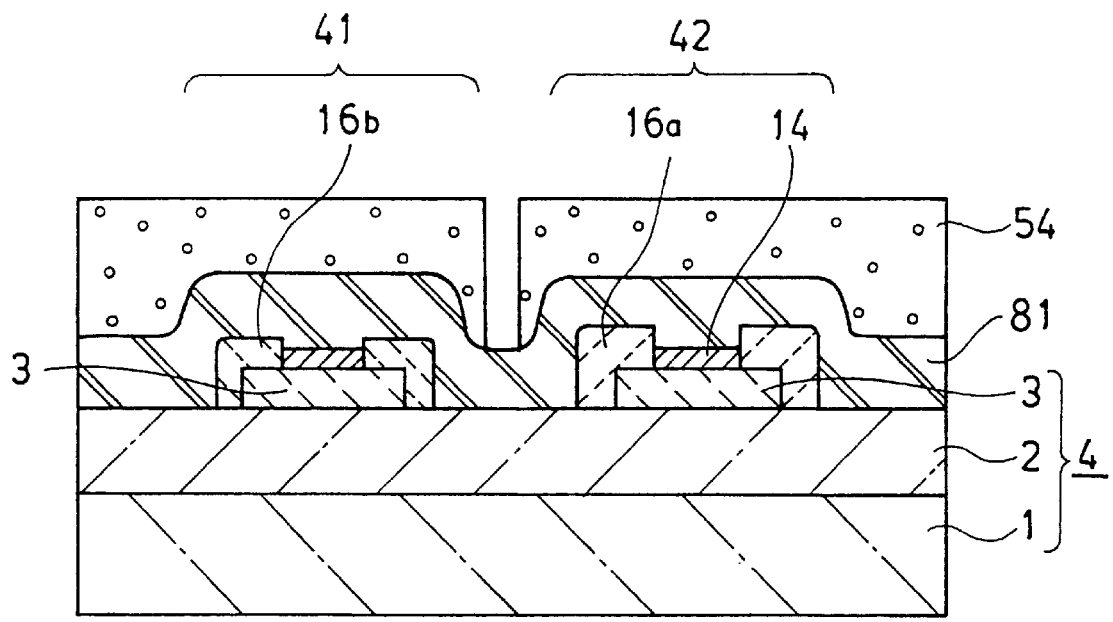

A photosensitive resin, namely photosensitive material, is then applied to the entire surface of the gate electrode material 81, and by the photolithographic techniques using a predetermined mask, a photosensitive resin 54 is formed, as shown in FIG. 21, in regions where gate electrodes are formed for the n-channel semiconductor device 41 and the p-channel semiconductor device 42 (FET elements), which are combined to form a MOS device.

Figure 22:
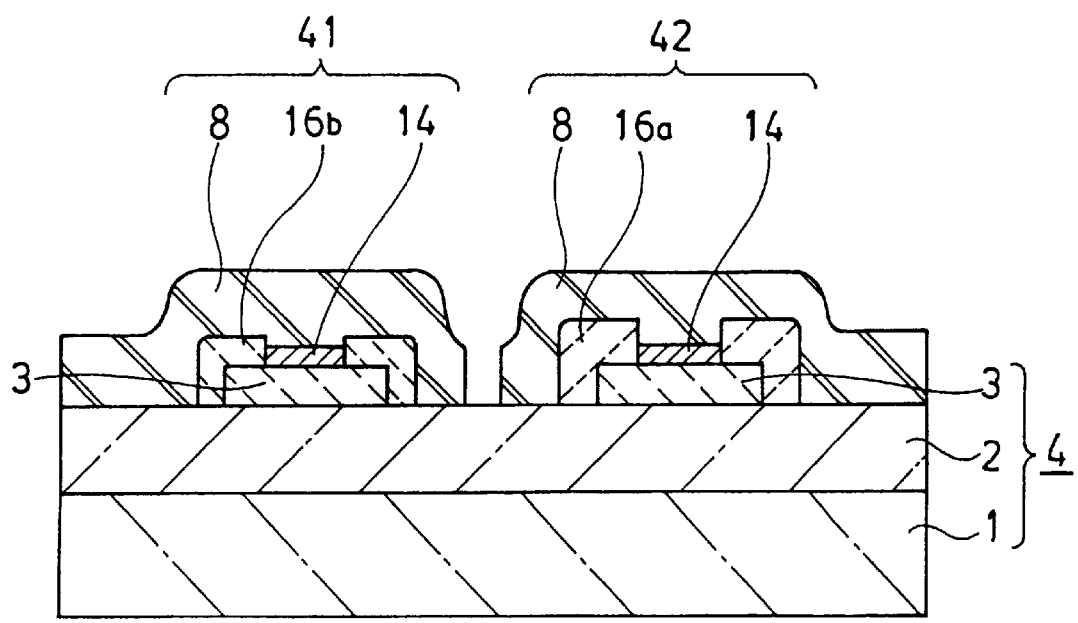

Then, by means of the dry etching method using a mixed gas containing sulfur hexafluoride ($SH_6$) and oxygen ($O_2$) with the photosensitive resin 54 as a mask, the gate electrode material 81, consisting of polycrystalline silicon film, is etched. Thereafter, the photosensitive resin 54 is removed, and, as shown in FIG. 22, the gate electrode 8 for the n-channel semiconductor device 41 and the p-channel semiconductor device 42, respectively, is formed.

In the next step, a photosensitive resin (not shown) is formed in the region of the p-channel semiconductor device 42, and using the photosensitive resin thus formed as a mask for ion implantation, arsenic (As), that is an n-type dopant, is introduced into the semiconductor layer 3 in the regions on the opposite sides of the gate electrode 8 of the n-channel semiconductor device 41 as shown in FIG. 2, thus forming heavily doped layers in the regions of a source 6 and a drain 5.

The dose of arsenic ions implanted for forming the heavily doped layers is in the order of $3 \times 10^{15}$ cm$^{-2}$ and the ions are implanted at an ion implantation energy of 50 KeV. Thereafter, the photosensitive resin used as the mask is removed.

Subsequently, a photosensitive resin (not shown) is formed in the region of the n-channel semiconductor device 41, and using the photosensitive resin thus formed as a mask for ion implantation, boron (B), that is a p-type dopant, is introduced into the semiconductor layer 3 in the regions on the opposite sides of the gate electrode 8 of the p-channel semiconductor device 42 as shown in FIG. 2, thus forming heavily doped layers in the regions of the source 6 and the drain 5. The dose of boron ions implanted for forming the heavily doped layers is in the order of $3 \times 10^{15}$ cm$^{-2}$ and the ions are implanted at an ion implantation energy of 30 KeV. Thereafter, the photosensitive resin used as the mask is removed.

The activation of the dopants introduced by the ion implantation process as above is carried out in a nitrogen atmosphere under an annealing condition at 900° C. for 20 minutes. The activation treatment for the dopants may be applied after the formation of an interlayer dielectric film in the succeeding step of processing.

Figure 23:
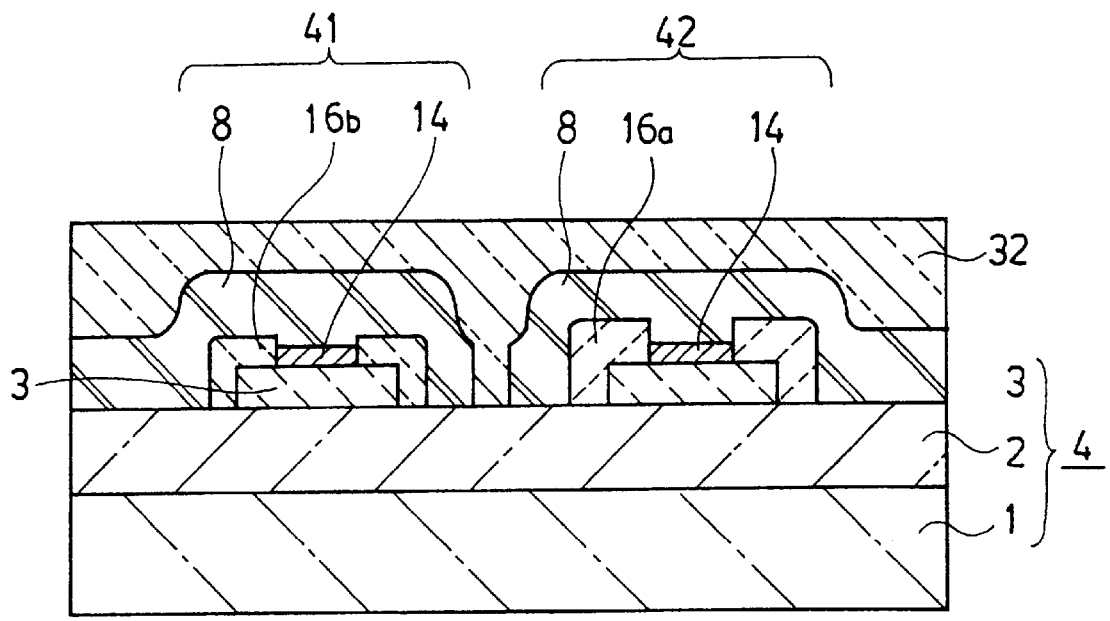

As shown in FIG. 23, the interlayer dielectric film 32 consisting of a silicon dioxide film containing phosphorus (P) and boron (B) is formed to a thickness in the order of 400 nm to cover the entire surface of the SOI substrate 4 by means of the chemical vapor deposition method.

Thereafter, photosensitive resin (not shown) is applied to the surface of the interlayer dielectric film 32 by means of the spinner, and a pattern is formed on the photosensitive resin by the photolithographic technique using a predetermined mask such that the photosensitive resin has openings in regions corresponding to contact holes 21 as shown in FIGS. 1 and 2.

Figure 24:
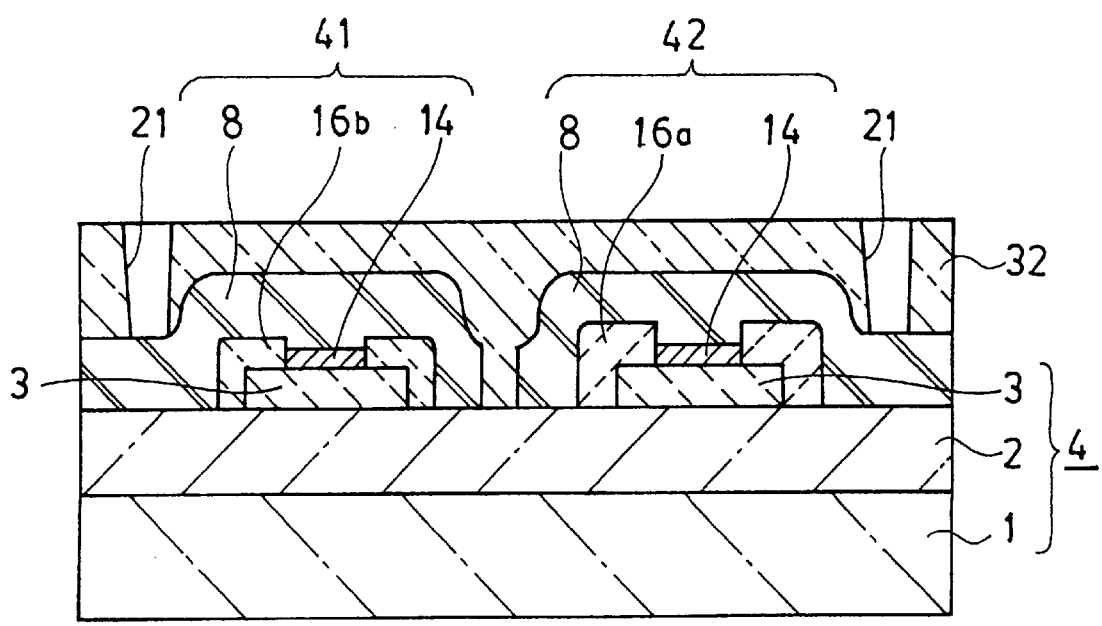

Using the photosensitive resin patterned above as an etching mask, the interlayer dielectric film 32 is etched, and the contact holes 21 are formed at positions opposite to the gate electrode 8, the source 6, and the drain 5 of the n-channel semiconductor device 41 and the p-channel semiconductor device 42, respectively, as shown in FIG. 24.

The etching for forming the contact holes 21 is carried out by means of a reactive ion etching apparatus, using a mixed gas containing methane trifluoride ($CHF_3$) and methane difluoride ($CHF_2$) as an etching gas.

Thereafter, using a sputtering apparatus, a wiring material consisting of aluminum containing silicon and copper is deposited on the internal surface of each of the contact holes 21 and on the entire surface of the interlayer dielectric film 32, forming a film to a thickness in the order of 800 nm.

In the next step, a photosensitive resin (not shown) is applied to the surface of the wiring material by means of the spinner, and a pattern is formed on the photosensitive resin by the photolithographic technique such that the photosensitive resin has a pattern corresponding to wiring interconnections 33a, 33b, and 33c as shown in FIG. 2.

Then, using the photosensitive resin as an etching mask, the wiring material is etched, forming the wiring connections 33a, 33b, and 33c, each having one end connected to the gate electrode 8, the source 6, and the drain 5, respectively, of the n-channel semiconductor device 41 and the p-channel semiconductor device 42, respectively, as shown in FIGS. 1 and 2.

The etching for forming the wiring connection 33 is carried out by means of the reactive ion etching apparatus, using a mixed gas containing chlorine ($Cl_2$) and boron trichloride ($BCl_3$ as an etching gas.

A MOS device according to the invention, having a sectional structure as shown in FIG. 1 and a plane structure as shown in FIG. 2, is fabricated by the method described in the foregoing.

The MOS device fabricated as above is provided with a first boundary film 16a and a second boundary film 16b around the peripheries of respective islands of the semiconductor layer 3. As the first boundary film 16a and the second boundary film 16b are insulation films thicker than the gate oxide film 14, the threshold voltage of the parasitic MOS region 9 (refer to FIG. 1) is increased. As a result, leakage current due to the parasitic MOS structure can be suppressed.

In addition, the second boundary film 16b is an insulation film thinner than the first boundary film 16a. Consequently, the magnitude of positive electric charge occurring in an oxide film in an environment subjected to radiation exposure is less for the second boundary film 16b than for the first boundary film 16a, thus reducing leakage current occurring in the n-channel semiconductor device 41 under exposure to radiation.

[Embodiment 2 of a method of fabricating a MOS device: FIGS. 7 to 24]

As Embodiment 2 of a method of fabricating a MOS device, according to the invention, a method of fabricating the MOS device (Embodiment 2 of a MOS device), as shown in FIGS. 1 and 3, is described hereafter.

Embodiment 2 is nearly the same as Embodiment 1. In other words, all the steps of processing in Embodiment 2 are the same as those in Embodiment 1 except that, in the step of patterning on the photosensitive resin 53 as shown in FIG. 17, a pattern is formed such that the semiconductor layer 3 is provided with openings in the channel forming regions and also other regions, completely surrounding the periphery of respective islands of the semiconductor layer 3 as shown in the plan view of FIG. 3, where the first boundary film 16a and the second boundary film 16b can be formed. The MOS device of Embodiment 2 can be fabricated by this method.

[Embodiment 3 of a method of fabricating a MOS device: FIGS. 25 to 39]

Figure 38:
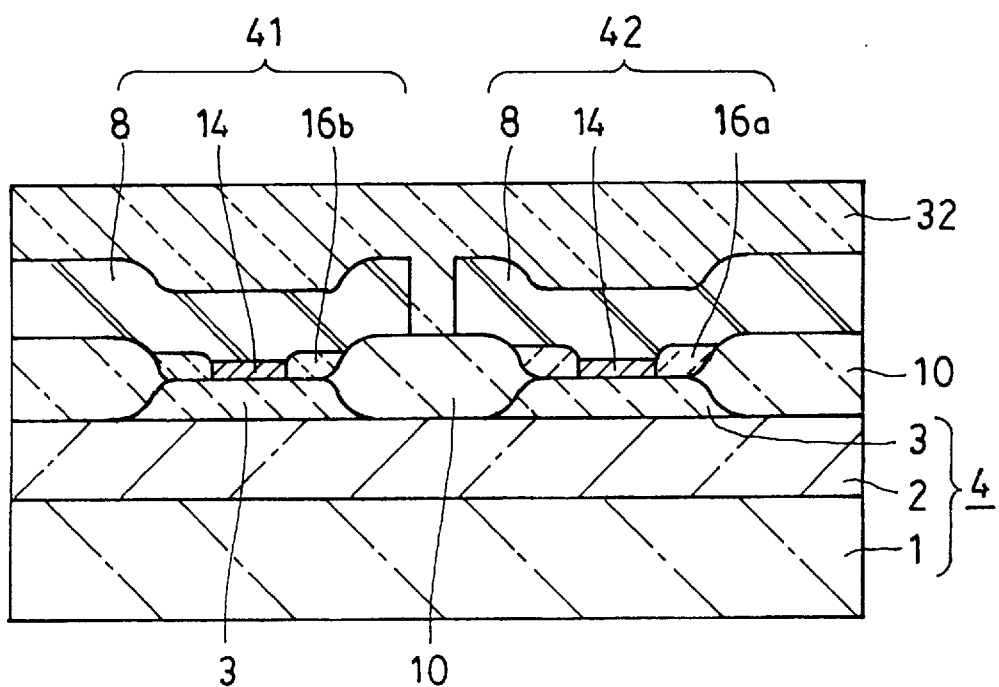
Figure 39:
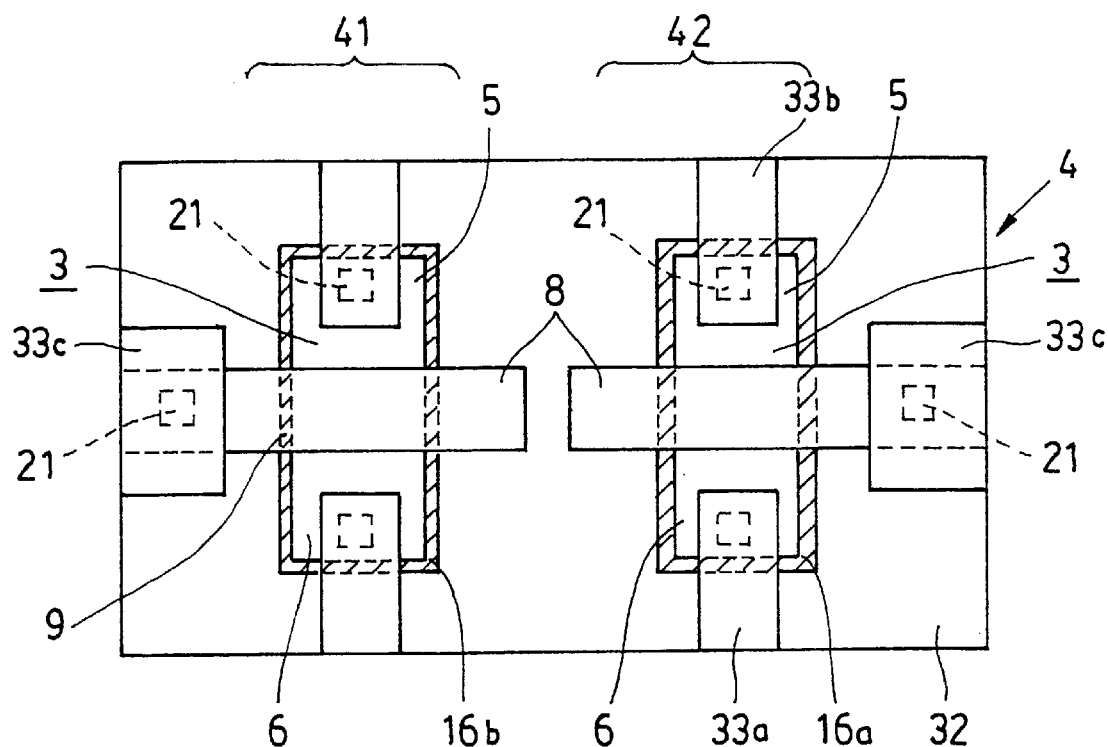
FIG. 39 is a plan view showing a plane structure of the MOS device fabricated by Embodiment 3 of a fabricating method according to the invention.

As Embodiment 3 of a method of fabricating a MOS device, according to the invention, a method of fabricating the MOS device as shown in FIG. 4 (Embodiment 3 of a MOS device) is described hereafter, with reference to FIGS. 7 and 8, and FIGS. 25 to 38, indicating the sectional views of the MOS device in respective steps of fabrication, and also FIG. 4 showing the sectional structure of the completed MOS device, and FIG. 39 showing a plane structure of the same.

Component parts appearing in FIGS. 25 to 39, corresponding to those in FIGS. 1 to 24, are indicated by identical reference numerals.

In this case too, there is formed an SOI substrate 4 consisting of laminated layers of an insulation film 2, made of silicon dioxide, formed to a thickness of 80 nm on top of a supporting substrate 1, and a semiconductor layer 3, made of silicon, formed to a thickness of 180 nm on the surface of the insulation film 2. In this Embodiment, a p-type semiconductor is used for the semiconductor layer 3 formed on top of the SOI substrate 4.

As shown in FIG. 8, an oxide film 17 is formed to a thickness of 180 nm by oxidizing the semiconductor layer 3 formed on top of the SOI substrate 4. The oxide film 17 is oxidized in a water vapor atmosphere at 950° C. for 40 minutes.

Figure 25:
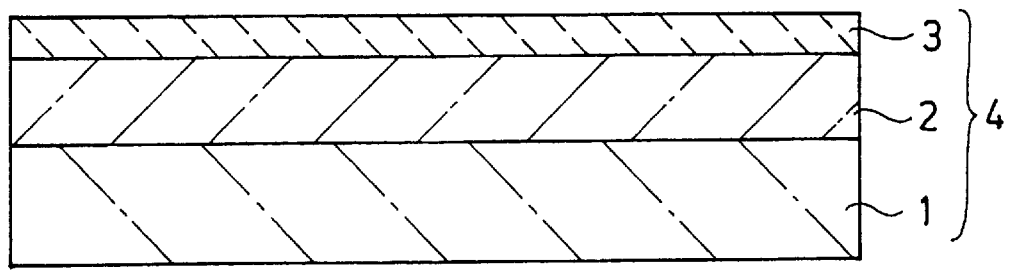
FIGS. 25 to 38 are section views of the semiconductor device in respective steps of processing, illustrating Embodiment 3 of a method of fabricating a MOS device, according to the invention.

Thereafter, the oxide film 17 is removed by etching the entire surface thereof, using hydrofluoric acid containing hydrogen fluoride (HF). As a result, the semiconductor layer 3 is reduced to a thickness of about 90 nm as shown in FIG. 25. Although the semiconductor layer 3 and the insulation film 2 are of a similar thickness, the semiconductor layer 3 is shown thinner than the insulation film 2 in FIG. 25 for convenience of illustration.

By reducing the semiconductor layer 3 to a thickness of 100 nm or less as in this case, the majority of electric charge in the depletion layer of a semiconductor device comes to be controlled by the gate potential contributing to the suppression of the short channel effect and enhancement of the current driving capacity.

Figure 26:
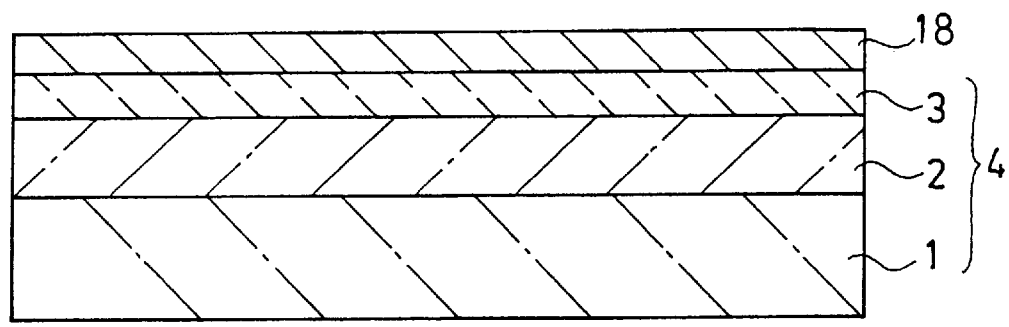

Subsequently, as shown in FIG. 26, a pad oxide film 18, consisting of silicon oxide, is formed to a thickness of 20 nm by oxidizing the semiconductor layer 3 in an oxidizing atmosphere. Although the thickness of the pad oxide film 18 is less than ¼ that of the semiconductor layer 3, both are shown in FIG. 26 as if they were of a similar thickness for convenience of illustration.

The oxidization treatment for forming the pad oxide film 18 is carried out in an oxygen atmosphere at 900° C. for 25 minutes.

Figure 27:
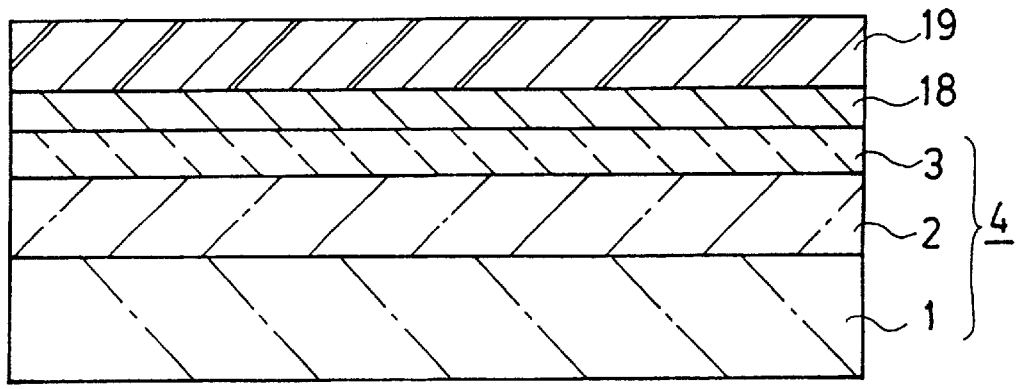

Then, as shown in FIG. 27, a silicon nitride film 19 is formed to a thickness of 100 nm on the entire surface of the pad oxide film 18 formed on top of the SOI substrate 4 by means of the chemical vapor deposition using dichlorosilane and ammonia as a reactive gas.

Figure 28:
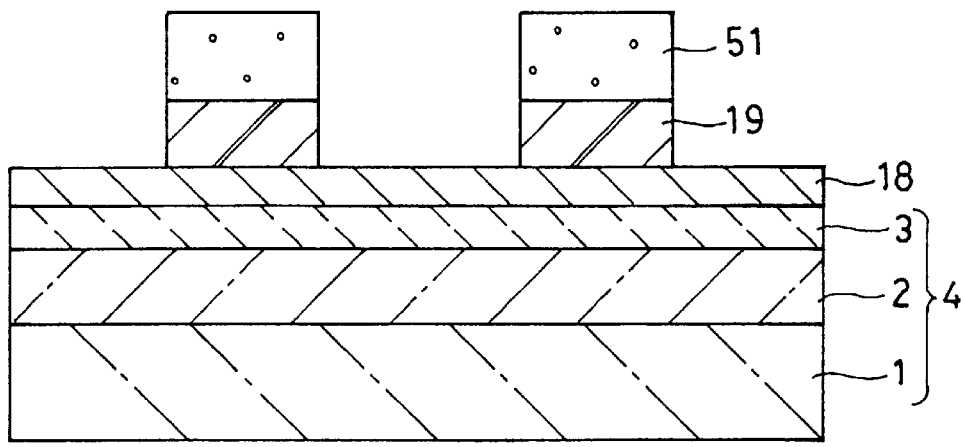

In the next step, a photosensitive resin is applied to the entire surface of the silicon nitride film 19 by means of the spinner method, and a pattern is formed on the photosensitive resin 51 by the photolithographic techniques such that the photosensitive resin 51 is left intact in the channel forming regions of the semiconductor layer 3 as shown in FIG. 28.

In further reference to FIG. 28, the silicon nitride film 19 is then etched, using the photosensitive resin 51 as an etching mask. The etching of the silicon nitride film 19 is carried out by means of the reactive ion etching apparatus, using a mixed gas consisting of sulfur hexafluoride ($SF_6$), methane trifluoride ($CHF_3$), and helium (He) as an etching gas.

Figure 29:
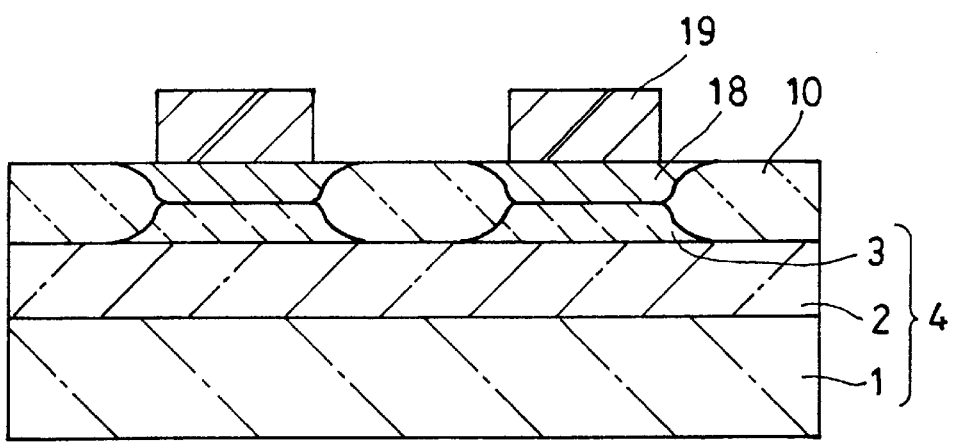

Thereafter, as shown in FIG. 29, the photosensitive resin 51 is removed, and a field oxide film 10 is formed to a thickness of 240 nm by means of local oxidation of silicon (LOCOS) using the silicon nitride film 19 as an oxidation-resistant mask. The local oxidation treatment is applied in a water vapor atmosphere at 950° C. for 60 minutes.

Figure 30:
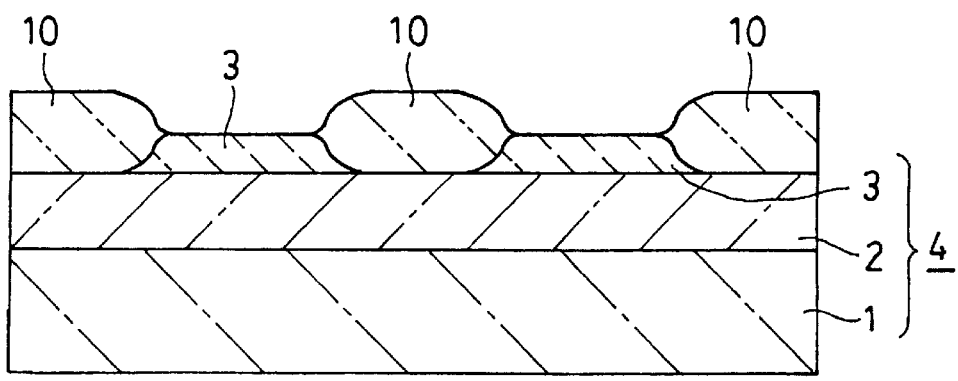

In the next step, the silicon nitride film 19 which served as an oxidation-resistant mask is removed by use of heated phosphoric acid, and then the pad oxide film 18 is also removed. Consequently, a structure, as shown in FIG. 30, wherein respective islands of the semiconductor layer 3 are completely insulated and isolated from each other by the field oxide film 10 and the insulation film 2 is formed.

Figure 31:
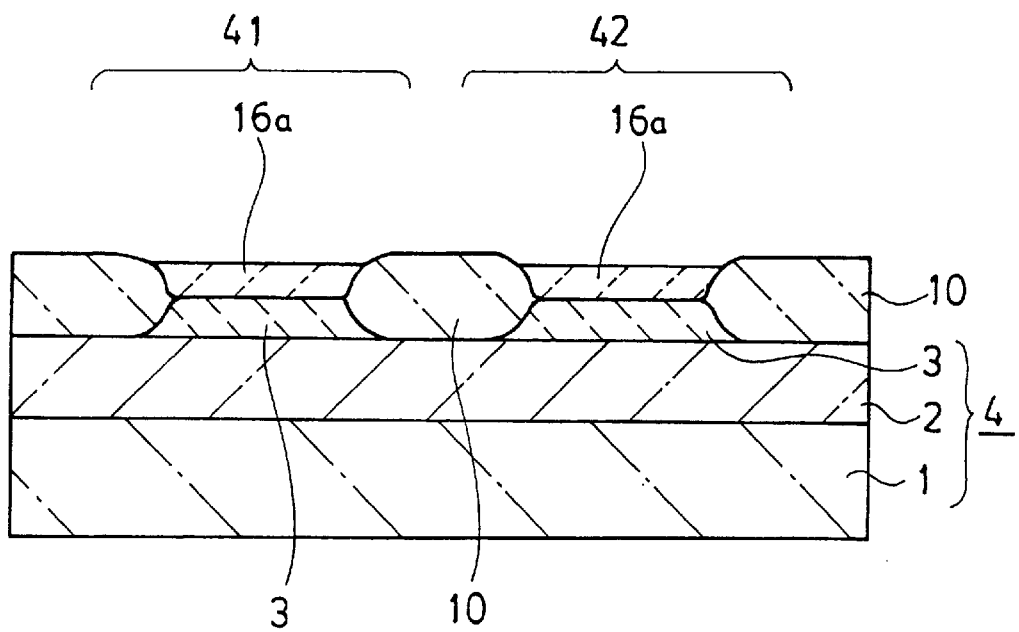

As shown in FIG. 31, a first boundary film 16a consisting of silicon oxide is formed to a thickness of 20 nm on the semiconductor layer 3 by oxidizing the semiconductor layer 3. The oxidation of the semiconductor layer 3 for forming the first boundary film 16a is carried out in an atmosphere of a mixed gas consisting of oxygen and nitrogen at 1000° C. for 25 minutes.

Figure 32:
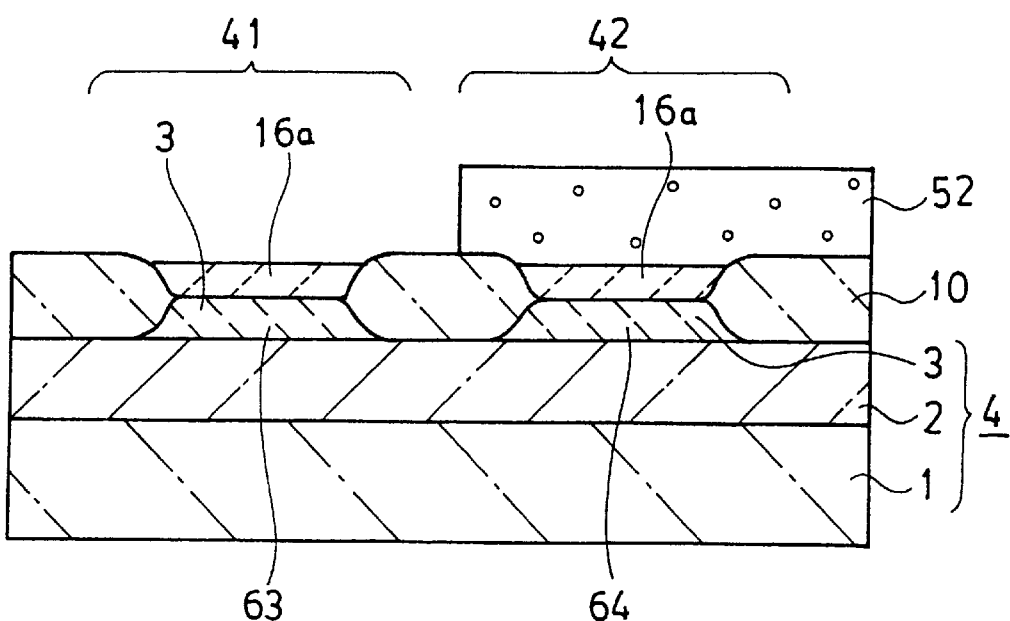

Then, a photosensitive resin is applied to the entire surface of the SOI substrate 4 by means of the spinner, and, as shown in FIG. 32, a pattern is formed on a photosensitive resin 52 by the photolithographic techniques using a predetermined mask such that the photosensitive resin 52 has openings in regions covering the island of the semiconductor layer 3 for forming an n-channel semiconductor device 41 and the periphery thereof.

Using the photosensitive resin 52 as a mask for ion implantation, boron (B), that is a p-type dopant, is introduced into the semiconductor layer 3 of an n-channel semiconductor device 41, thus forming a p-type channel doped layer 63. The dose of boron ions implanted for forming the p-type channel doped layer is in the order of $3 \times 10^{12}$ cm$^{-2}$ and the ions are implanted at an ion implantation energy of 25 KeV. Thereafter, the photosensitive resin 52 is removed.

Then, omitting any reference to figures, a photosensitive resin is again applied to the entire surface of the SOI substrate 4, and a pattern is formed on a photosensitive resin 52 such that the photosensitive resin 52 has openings in regions covering the island of the semiconductor layer 3 for forming a p-channel semiconductor device 42 and the periphery thereof. Accordingly, the photosensitive resin 52 is formed in the left half part, opposite to the situation shown in FIG. 32.

Using the photosensitive resin 52 as a mask for ion implantation, phosphorus, that is an n-type dopant, is introduced into the semiconductor layer 3 of a p-channel semiconductor device 42, forming an n-type channel doped layer 64. The dose of phosphorus ions implanted for forming the n-type channel doped layer 64 is in the order of $2 \times 10^{12}$ cm$^{-2}$ and the ions are implanted at an ion implantation energy of 30 KeV. Thereafter, the photosensitive resin 52 is removed.

Again, a photosensitive resin is applied to the entire surface of the SOI substrate 4 by means of the spinner, and, as shown in FIG. 32, a pattern is formed on a photosensitive resin 52 by the photolithographic techniques using a predetermined mask such that the photosensitive resin 52 has openings in a region covering the island of the semiconductor layer 3 for forming an n-channel semiconductor device 41.

Then, using the photosensitive resin 52 as an etching mask, a first boundary film 16a formed on the island of the semiconductor layer 3 for forming the n-channel semiconductor device 41 is removed by means of etching. The etching of the first boundary film 16a is carried out by use of hydrofluoric acid containing HF. Thereafter, the photosensitive resin 52 is removed.

Figure 33:
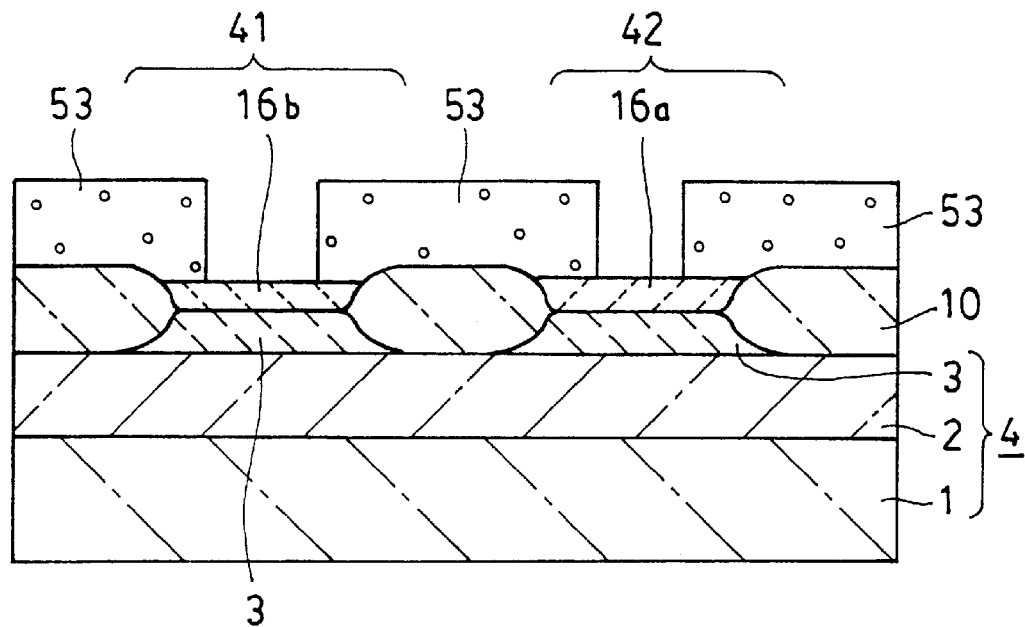
Figure 34:
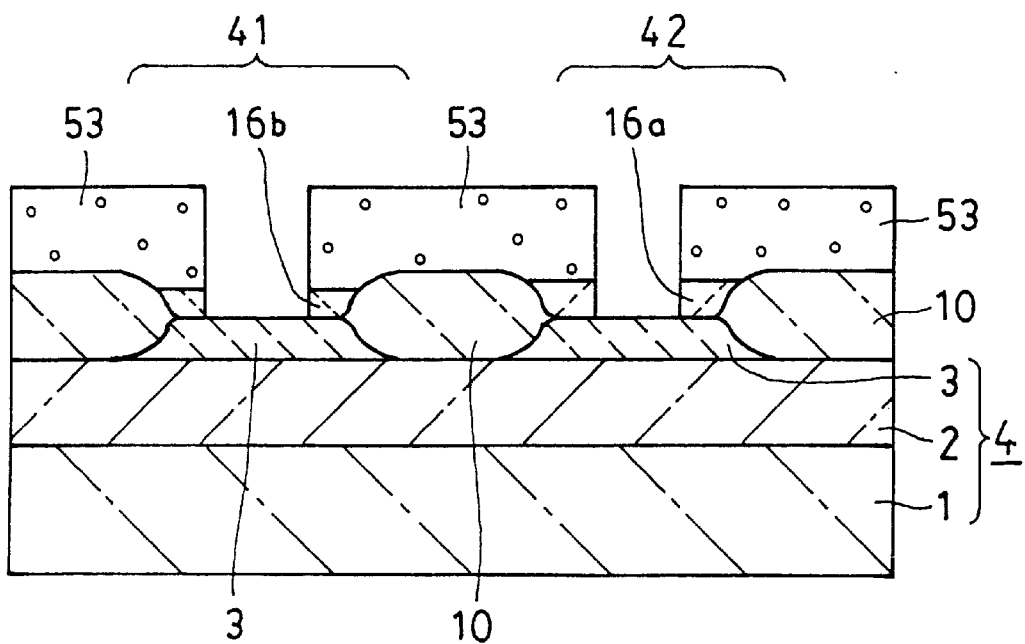

As shown in FIG. 33, a second boundary film 16b consisting of silicon oxide is formed to a thickness of 15 nm by oxidizing the semiconductor layer 3. The oxidation treatment for forming the second boundary film 16b is applied in an atmosphere of a mixed gas consisting of oxygen and nitrogen at 1000° C. for 25 minutes. The second boundary film 16b is formed on the surface of the semiconductor layer 3 of the n-channel semiconductor device 41. An increase in the thickness of the semiconductor layer 3 of the p-channel semiconductor device 42 due to the oxidation treatment described above is minimal owing to the presence of the first boundary film 16a.

Again, a photosensitive resin is applied to the entire surface of the SOI substrate 4 by means of the spinner, and, as shown in FIG. 33, a pattern is formed on a photosensitive resin 53 by the photolithographic techniques using a predetermined mask such that the photosensitive resin 53 has openings in channel forming regions, and furthermore, the first boundary film 16a and the second boundary film 16b can be formed as indicated by the diagonally shaded areas in FIG. 39.

Also, the patterning is formed such that the first boundary film 16a is left intact up to 0.6 μm from the edges of the island of the semiconductor layer 3 toward the element region, and the second boundary film 16b is left intact up to 0.4 μm from the edges of the island of the semiconductor layer 3 toward the element region, both surrounding the entire periphery of respective islands of the semiconductor layer 3.

As the distance of the overlapping part of the second boundary film 16b on the semiconductor layer 3 is shorter than that of the first boundary film 16a as described above, the magnitude of positive electric charge that occurs in the second boundary film 16b is reduced, suppressing variation in the threshold voltage of the n-channel semiconductor device 41.

Also, the patterning may be formed as indicated by slant lines in FIG. 2, such that the first boundary film 16a is left intact up to 0.6 μm from the edges of the island of the semiconductor layer 3 toward the element region, the second boundary film 16b is left intact up to 0.4 μm from the edges of the island of the semiconductor layer 3 toward the element region, and further, both boundary films are made longer by 1 μm than the width (the channel length) of the gate electrode 8 on both side.

Then, using the photosensitive resin 53 as an etching mask, the first boundary film 16a and the second boundary film 16b in respective channel forming regions are removed by means of etching. The etching is carried out by use of hydrofluoric acid containing HF.

In this way, the first boundary film 16a is formed covering areas up to 0.6 μm from the both edge of the island of the semiconductor layer 3 toward the element region for the p-channel semiconductor device 42, and the second boundary film 16b is formed covering areas up to 0.4 μm from the both edge of the island of the semiconductor layer 3 toward the element region for the n-channel semiconductor device 41. Thereafter, the photosensitive resin 53 is removed.

Figure 35:
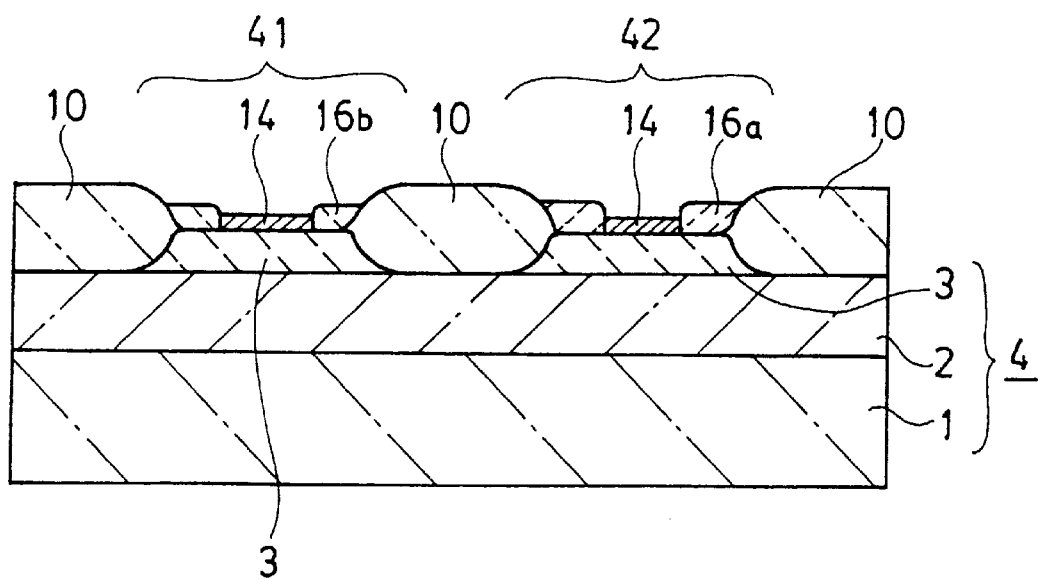

Subsequently, as shown in FIG. 35, a gate oxide film 14 consisting of silicon oxide is formed to a thickness of 10 nm by oxidizing the semiconductor layer 3. Such an oxidation treatment is applied in an oxygen atmosphere at 900° C. for 25 minutes.

As a result, a structure is formed wherein the first boundary film 16a and the second boundary film 16b, thicker than the gate oxide film 14, are formed on the edges of respective islands of the semiconductor layer 3. Consequently, the threshold voltage of a parasitic MOS regions becomes higher, and leakage current due to the parasitic MOS structure can be reduced.

The second boundary film 16b is an insulation film thinner than the first boundary film 16a. Therefore, positive electric charge that occurs in an oxide film under exposure to radiation is less in the second boundary film 16b, resulting in the reduction of leakage current in the n-channel semiconductor device 41 under exposure to radiation.

Figure 36:
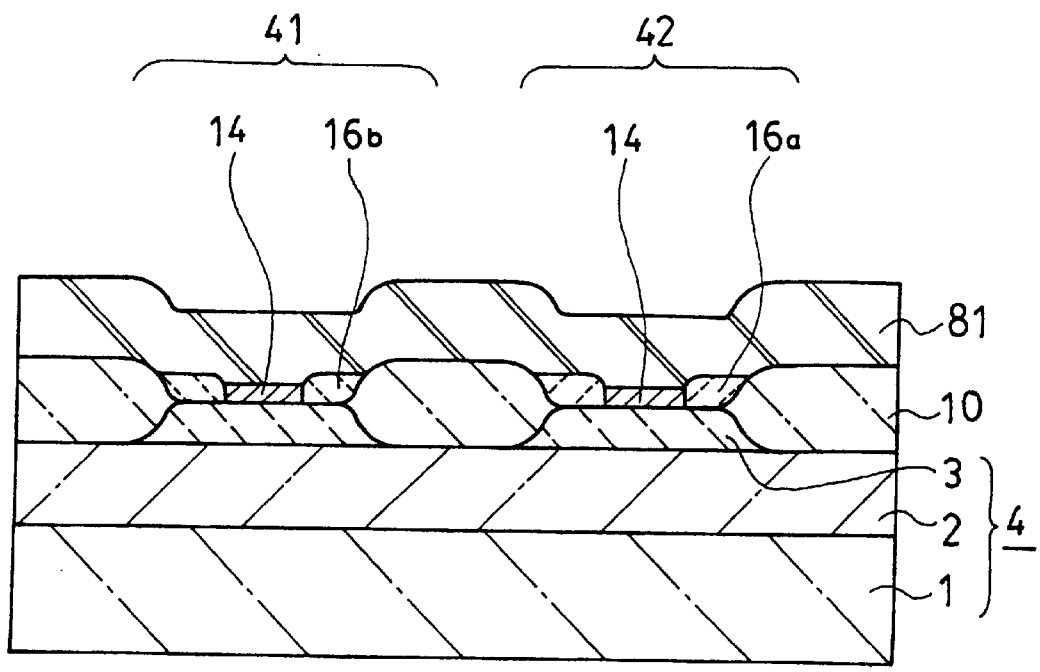

As shown in FIG. 36, a gate electrode material 81 consisting of polycrystalline silicon 400 nm thick is then formed on the entire surface of the SOI substrate 4 by means of the chemical vapor deposition method using mono silane (SiH$_4$) as reactive gas.

Figure 37:
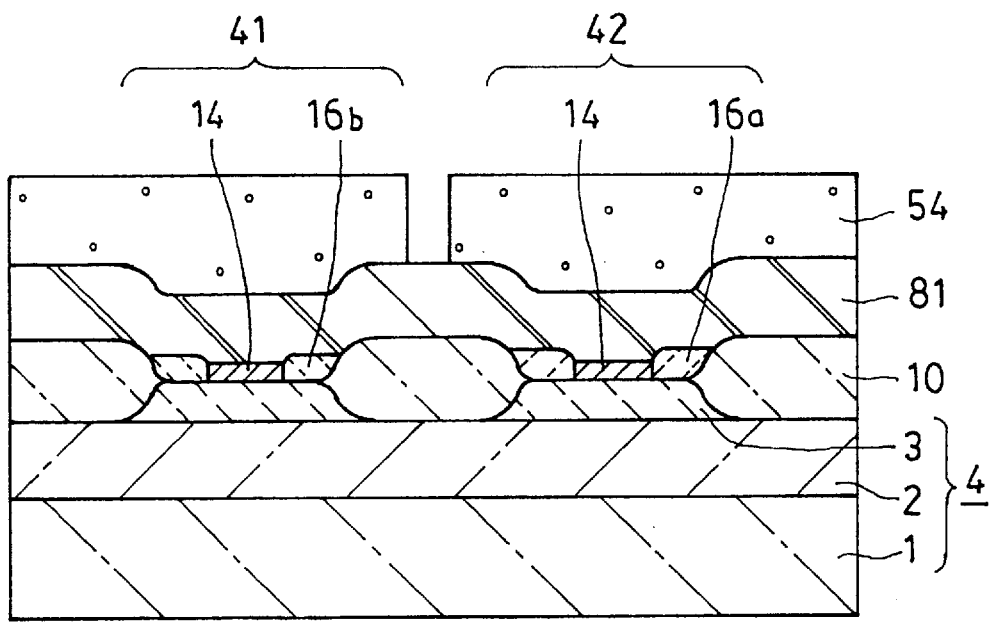

A photosensitive resin, namely photosensitive material, is then applied to the entire surface of the gate electrode material 81, and by the photolithographic techniques using a predetermined mask, a photosensitive resin 54 is formed, as shown in FIG. 37, in regions where gate electrodes are formed for the n-channel semiconductor device 41 and the p-channel semiconductor device 42, that is, MOS FET elements.

Then, by means of the dry etching method using a mixed gas containing sulfur hexafluoride (SH$_6$) and oxygen (O$_2$) with the photosensitive resin film 54 as a mask, the gate electrode material 81, consisting of polycrystalline silicon film, is etched, and the gate electrodes 8 as shown in FIG. 38 are formed. Thereafter, the photosensitive resin 54 is removed, In the next step, a photosensitive resin (not shown) is formed in the region of the p-channel semiconductor device 42, and using the photosensitive resin thus formed as a mask for ion implantation, arsenic (As), that is an n-type dopant, is introduced into the semiconductor layer 3 in the regions on the opposite sides of the gate electrode 8 of the n-channel semiconductor device 41 as shown in FIG. 39, thus forming heavily doped layers in the regions of a source 6 and a drain 5.

The dose of arsenic ions implanted for forming the heavily doped layers to function as the source 6 and the drain 5 is in the order of $3\times10^{15}$ cm$^{-2}$ and the ions are implanted at an ion implantation energy of 50 KeV. Thereafter, the photosensitive resin is removed.

Similarly, a photosensitive resin (not shown) is formed in the region of the n-channel semiconductor device 41, and using the photosensitive resin thus formed as a mask for ion implantation, boron (B), that is a p-type dopant, is introduced into the semiconductor layer 3 in the regions on the opposite sides of the gate electrode 8 of the p-channel semiconductor device 42 as shown in a plan view of FIG. 39, thus forming heavily doped layers in the regions of a source 6 and a drain 5. The dose of boron ions implanted for forming the heavily doped layers is in the order of $3\times10^{15}$ cm$^{-2}$ and the ions are implanted at an ion implantation energy of 30 KeV. Thereafter, the photosensitive resin is removed.

Then, as shown in FIG. 38, an interlayer dielectric film 32 consisting of a silicon dioxide film containing phosphorus (P) and boron (B) is formed to a thickness in the order of 400 nm to cover the entire surface of the SOI substrate 4 by means of the chemical vapor deposition method. Thereafter, an annealing treatment for activation of the dopants introduced by the ion implantation process and reflow of the interlayer dielectric film 32 is applied in a nitrogen atmosphere under at 900° C. for 20 minutes.

In the next step, photosensitive resin (not shown) is applied to the surface of the interlayer dielectric film 32 by means of the spinner, and a pattern is formed on a photosensitive resin by the photolithographic techniques using a predetermined mask such that the photosensitive resin has openings in regions corresponding to contact holes 21 as shown in FIG. 39.

Using the photosensitive resin patterned above as an etching mask, the interlayer dielectric film 32 is etched, and the contact holes 21 are formed.

The etching for forming the contact holes 21 is carried out by means of the reactive ion etching apparatus, using a mixed gas containing methane trifluoride (CHF$_3$) and methane difluoride (CHF$_2$) as an etching gas.

Thereafter, using a sputtering apparatus, a wiring material consisting of aluminum containing silicon and copper is deposited on the entire surface of the interlayer dielectric film 32, including the internal surface of each of the contact holes 21, forming a film to a thickness in the order of 800 nm.

In the next step, a photosensitive resin is applied to the surface of a wiring material by means of the spinner, and a pattern is formed on a photosensitive resin by the photolithographic techniques such that the photosensitive resin has a pattern corresponding to wiring connections 33a, 33b, and 33c as shown in FIG. 39.

Then, using the photosensitive resin thus patterned as an etching mask, the wiring material is etched, forming the wiring connections 33a, 33b, and 33c as shown in FIGS. 4 and 39. The etching for forming the wiring connections is carried out by means of the reactive ion etching apparatus, using a mixed gas containing chlorine (Cl$_2$) and boron trichloride (BCl$_3$) as an etching gas.

The MOS device according to the invention having the sectional structure as shown in FIG. 4 and the plane structure as shown in FIG. 39 is thus fabricated by this method.

[Embodiment 4 of a method of fabricating a MOS device: FIGS. 40 to 44]

Figure 43:
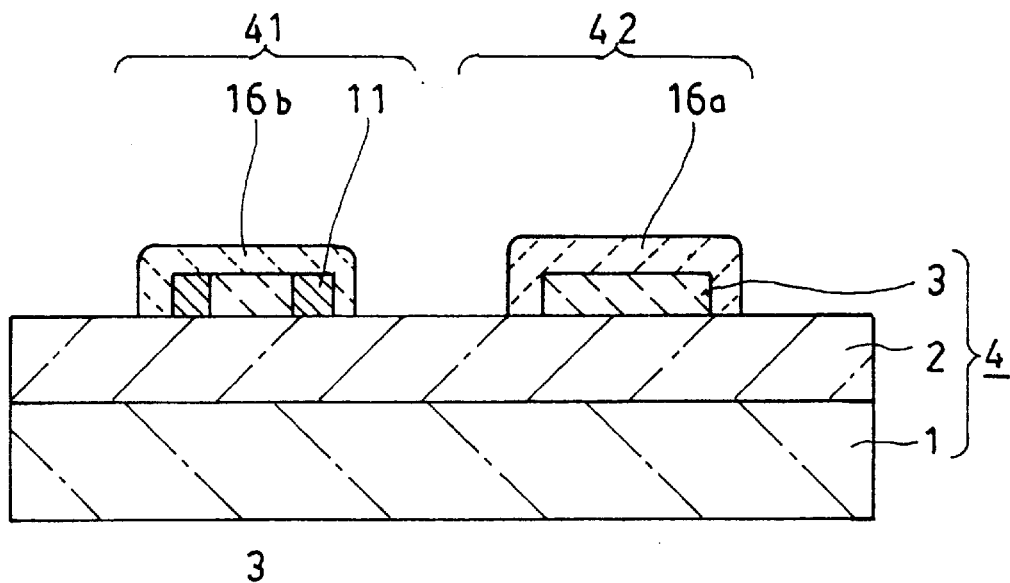
Figure 44:
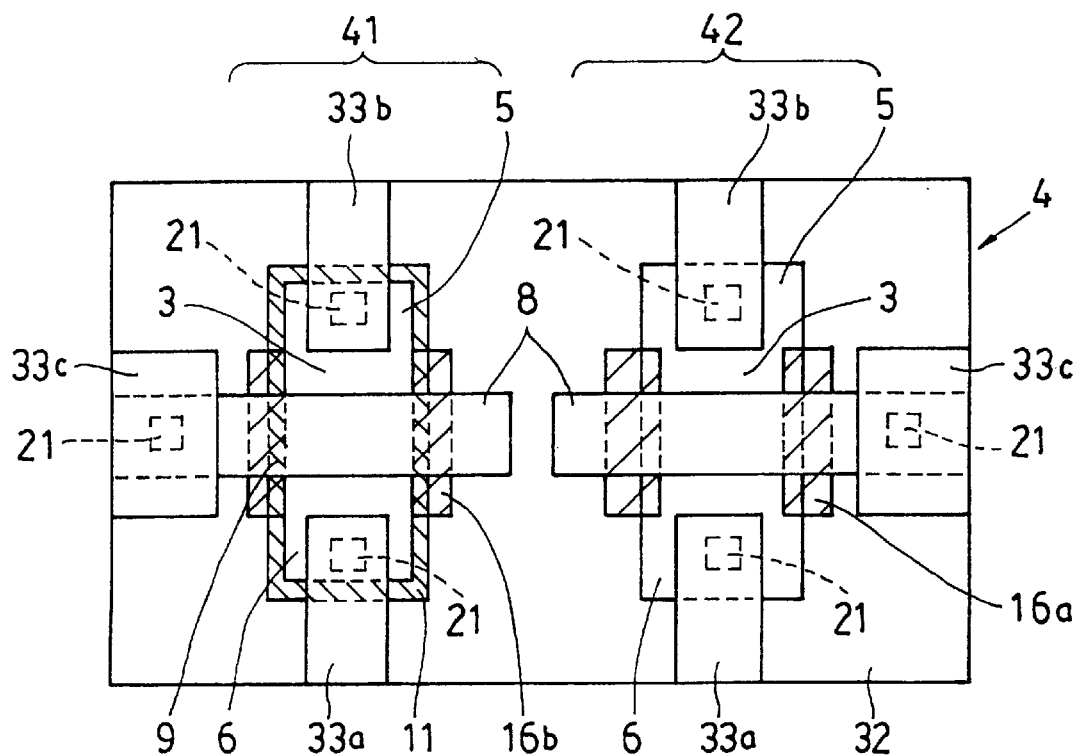
FIG. 44 is plan view showing a plane structure of the MOS semiconductor device fabricated by Embodiment 4 of a fabricating method according to the invention.

As Embodiment 4 of a method of fabricating a MOS device, according to the invention, a method of fabricating the MOS device as shown in FIG. 5 (Embodiment 4 of MOS device) is described hereafter, with reference to FIGS. 7 to 14, FIGS. 40 to 43, and FIGS. 17 to 24 showing the sectional views of the MOS device in respective steps of fabrication, and also FIG. 5 showing the sectional structure of the completed MOS device, and FIG. 44 showing a plane structure of the same.

Component parts appearing in FIGS. 40 to 44, corresponding to those in FIGS. 1 to 39, are indicated by identical reference numerals.

In this case too, an SOI substrate 4 of laminated layers, consisting of an insulation film 2, made of silicon dioxide, formed to a thickness of 80 nm on top of a supporting substrate 1 as shown in FIG. 7, and an n-type semiconductor layer 3, made of silicon, formed to a thickness of 180 nm on the surface of the insulation film 2 is in use as is the case with the aforesaid Embodiment 1 of a method of fabricating a MOS device.

As shown in FIG. 8, an oxide film 17 is formed to a thickness of 180 nm by oxidizing the semiconductor layer 3 formed on top of the SOI substrate 4. The oxide film 17 is formed by oxidation in a water vapor atmosphere at 950° C. for 40 minutes.

The succeeding steps are the same as those of the foresaid Embodiment 1 of a method of fabricating a MOS device according to the invention, described with reference to FIGS. 9 to 14.

In other words, as shown in FIG. 14, a semiconductor layer 3 patterned in a plurality of islands is formed on top of an SOI substrate 4, and a first boundary film 16a, consisting of silicon oxide, is formed on the surface of the semiconductor layer 3. Boron, a p-type dopant, is introduced into the semiconductor layer 3 of an n-channel semiconductor device 41, forming a p-type channel doped layer 63, and phosphorus, an n-type dopant, is introduced into the semiconductor layer 3 of a p-channel semiconductor device 42, forming an n-type channel doped layer 64.

Figure 40:
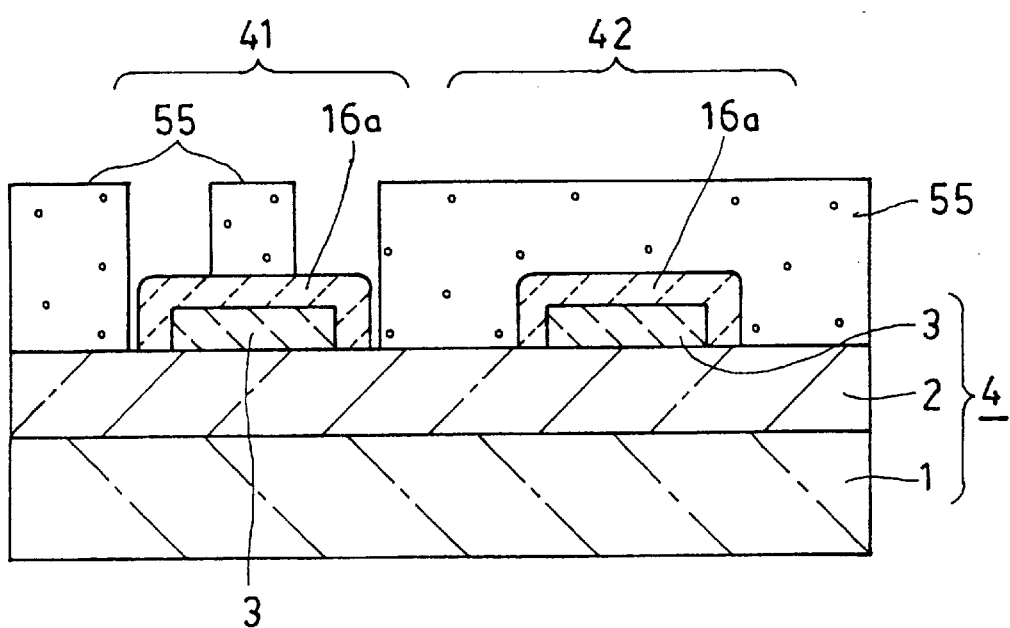
FIGS. 40 to 43 are section views of a semiconductor device in the processing steps differing from Embodiment 1, for illustrating Embodiment 4 of a method of fabricating a MOS semiconductor device, according to the invention.

Then, a photosensitive resin is applied to the entire surface of the SOI substrate by means of roll coating, and a pattern is formed on a photosensitive resin 55 by the photolithographic techniques using a predetermined photo mask such that the photosensitive resin 55 has an opening in a region covering the island of the semiconductor layer 3 for an n-channel semiconductor device 41 and the periphery thereof as shown in FIG. 40.

Also, the pattern is formed on the photosensitive resin 55 such that the openings cover areas up to 0.6 μm inside the element region from the edges of the island of the semiconductor layer 3.

Figure 41:
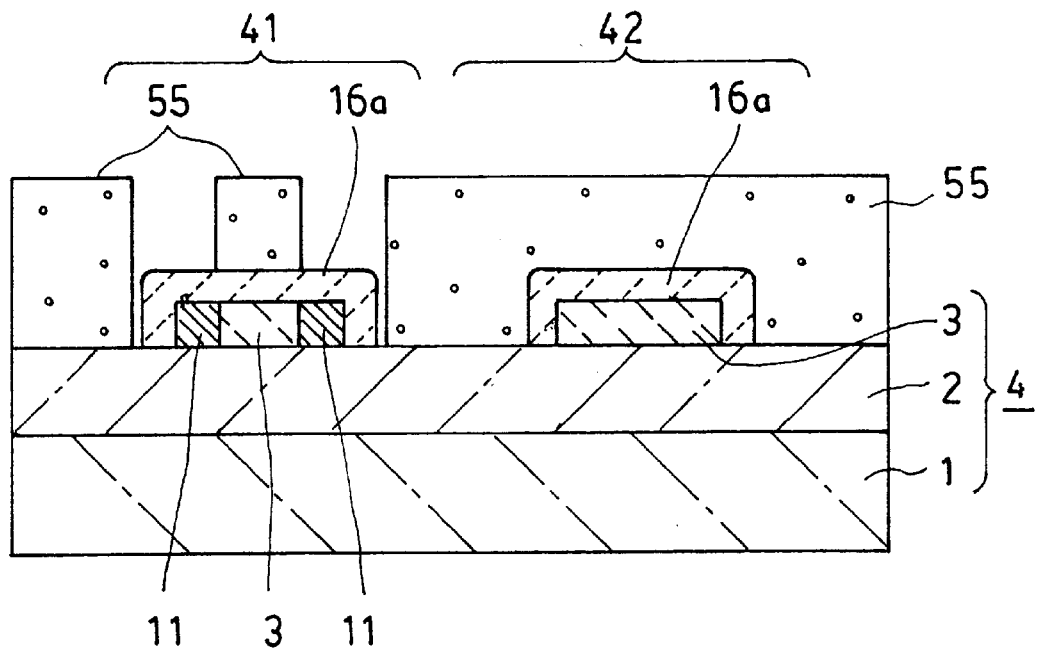

Using the photosensitive resin 55 as a mask for ion implantation, a field dope layer 11 is formed, as shown in FIG. 41, by introducing boron (B), that is, a p-type dopant in a peripheral region of the semiconductor layer 3 for forming an n-channel semiconductor device 41. The dose of boron ions implanted for forming the field dope layer 11 is in the order of $6\times10^{13}$ cm$^{-2}$, and ion implantation is carried out under an ion implantation energy at 30 keV. Thereafter, the photosensitive resin 55 is removed.

Figure 42:
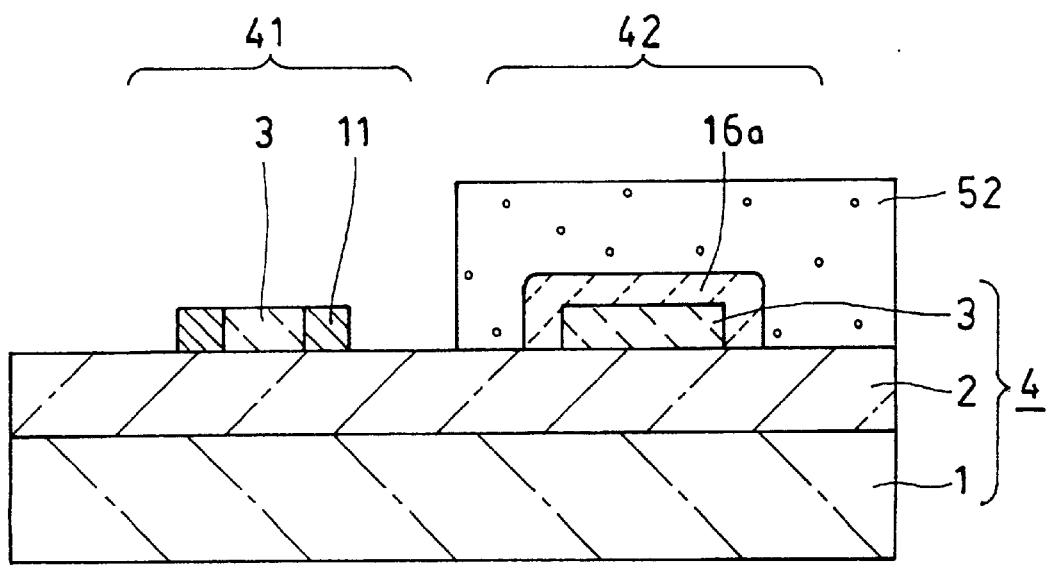

Subsequently, a photosensitive resin is again applied to the entire surface of the SOI substrate by means of the spinner, and a pattern is formed on a photosensitive resin 52 by the photolithographic techniques using a predetermined photo mask such that the photosensitive resin 52 has openings in a region covering the island of the semiconductor layer 3 for the n-channel semiconductor device 41 and the periphery thereof as shown in FIG. 42.

Using the photosensitive resin 52 as an etching mask, the first boundary film 16a formed on the semiconductor layer 3 in a region for the n-channel semiconductor device 41 is removed by the etching process. The etching process is applied to the first boundary film 16a using hydrofluoric acid containing HF. Thereafter, the photosensitive resin 52 is removed.

Then, as shown in FIG. 43, a second boundary film 16b consisting of silicon oxide is formed to a thickness of 15 nm by oxidizing the semiconductor layer 3 patterned in a plurality of islands on top of the SOI substrate 4. The second boundary film 16b is formed by applying an oxidation treatment in an atmosphere of a mixed gas containing oxygen and nitrogen at 1000° C. for 25 minutes. The second boundary film 16b is formed on the surface of the semiconductor layer 3 in the region where the n-channel semiconductor device 41 is to be formed, and is also formed, to a lesser extent, on the semiconductor layer 3 in the region where the p-channel semiconductor device 42 is to be formed. However, a resultant increase in the thickness thereof is minimal in this region because of the presence of the first boundary film 16a.

Succeeding steps of fabrication are the same as those of Embodiment 1 as described with reference to FIGS. 17 to 24, and FIGS. 1 and 2 except that the n-channel semiconductor device is provided with the field dope layer 11 in the peripheral region of the semiconductor layer 3.

More specifically, the first boundary film 16a and the second boundary film 16b are formed along the two sides of the periphery of respective islands of the semiconductor layer 3 by the etching process such that they are left intact up to 0.6 μm inside respective element regions from the edges of the semiconductor layer 3 and 1 μm longer than the width of the gate electrode 8 on each side thereof.

Subsequently, the respective islands of the semiconductor layer 3 are oxidized, and gate oxide films 14 are formed to a thickness of 10 nm in the channel region of the respective islands of the semiconductor layer 3.

Then, as shown in FIGS. 5 and 44, the gate electrode 8 for the n-channel semiconductor device 41 and p-channel semiconductor device 42, respectively, is formed, and heavily doped layers are formed in the source 6 region and the drain 5 region of the respective islands of the semiconductor layer 3.

Thereafter, an interlayer dielectric film 32 consisting of a silicon dioxide film containing phosphorus and boron is formed, and then etched, forming contact holes 21.

Finally, interconnections 33a, 33b, and 33c are formed for connection with the gate electrode 8, the source 6, and the drain 5, respectively, of the n-channel semiconductor device 41 and the p-channel semiconductor device 42 through the contact holes 21.

The MOS device according to the invention having the sectional structure as shown in FIG. 5 and the plane structure as shown in FIG. 44 is thus fabricated.

As the MOS device is provided with the field doped layer 11 formed in the peripheral region of the semiconductor layer 3, including the region of the second boundary film 16b, the threshold voltage of the parasitic MOS structure becomes high, reducing leakage current due to the parasitic MOS. Accordingly, a MOS device having radiation-resistant characteristics better than that of conventional semiconductor devices can be fabricated by this method.

[Embodiment 5 of a method of fabricating a MOS device: FIGS. 45 to 48]

As Embodiment 5 of a method of fabricating a MOS device, according to the invention, a method of fabricating the MOS device wherein respective islands of the semiconductor layer 3 are insulated and isolated from each other by the field oxide film 10 as shown in FIG. 4 (Embodiment 3 of a MOS device) and additionally the field doped layer 11 is formed in the peripheral region of the semiconductor layer 3 for the n-channel semiconductor device 41, including the region where the second boundary film 16b is formed, is described hereafter.

Most of the steps of fabrication in this embodiment are common to the aforesaid Embodiment 3 as described with reference to FIGS. 25 to 39. Therefore, the description of the common steps of fabricating the MOS device is omitted.

This Embodiment differs from Embodiment 3 only in that a processing step as described with reference to FIGS. 45 to 48 is added between the steps described in FIG. 32 and in FIG. 33.

Specifically, as shown in FIG. 32, upon formation of the first boundary film 16a consisting of silicon oxide on the surface of the semiconductor layer 3, boron is introduced into the semiconductor layer 3 of the n-channel semiconductor device 41 using the photosensitive resin 52 as a mask for ion implantation, forming a p-type channel doped layer 63.

Similarly, the photosensitive resin 52 is formed with opening in the region of the p-channel semiconductor device 42, and using the photosensitive resin as a mask for ion implantation, phosphorus is introduced into the semiconductor layer 3 of the p-channel semiconductor device 42, forming an n-type channel doped layer 64.

Up to this step, the method of fabrication in Embodiment 5 is the same as that in Embodiment 3.

Figure 45:
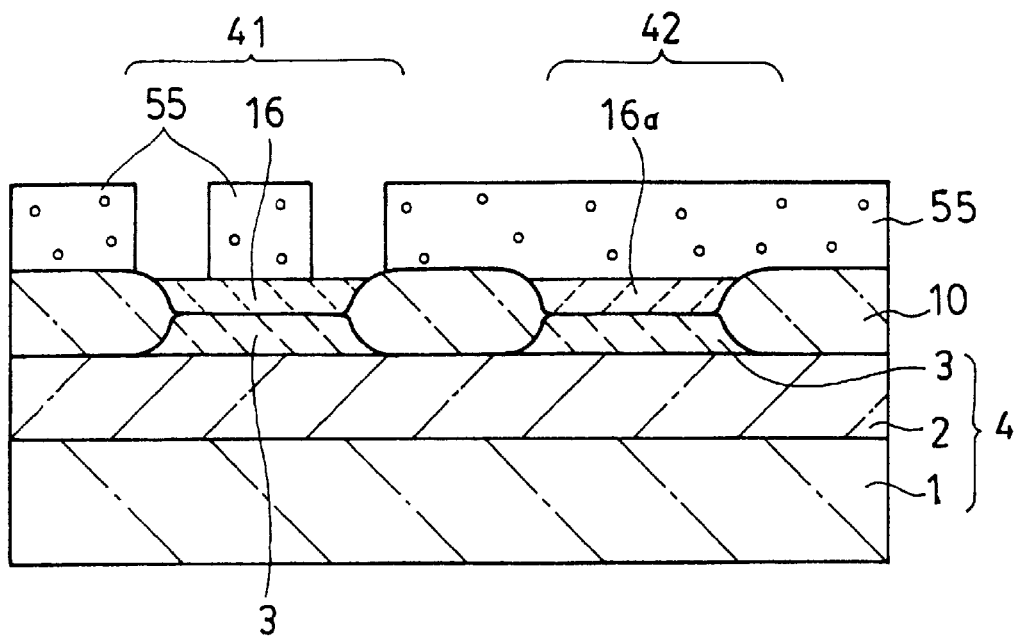
FIGS. 45 to 48 are section views of a semiconductor device in the processing steps differing from Embodiment 3 of a fabricating method, for illustrating Embodiment 5 of a method of manufacturing a MOS semiconductor device, according to the invention.

Then, a photosensitive resin is applied to the entire surface of the SOI substrate 4 by means of the spinner, and a pattern is formed on a photosensitive resin 55 by the photolithographic techniques using a predetermined photo mask such that the photosensitive resin 55 has an opening in a region covering the island of the semiconductor layer 3 for an n-channel semiconductor device 41 and the periphery thereof as shown in FIG. 45. Also, the pattern is formed on the photosensitive resin 55 such that the openings cover areas up to 0.6 μm inside the element region from the edges of the island of the semiconductor layer 3.

Figure 46:
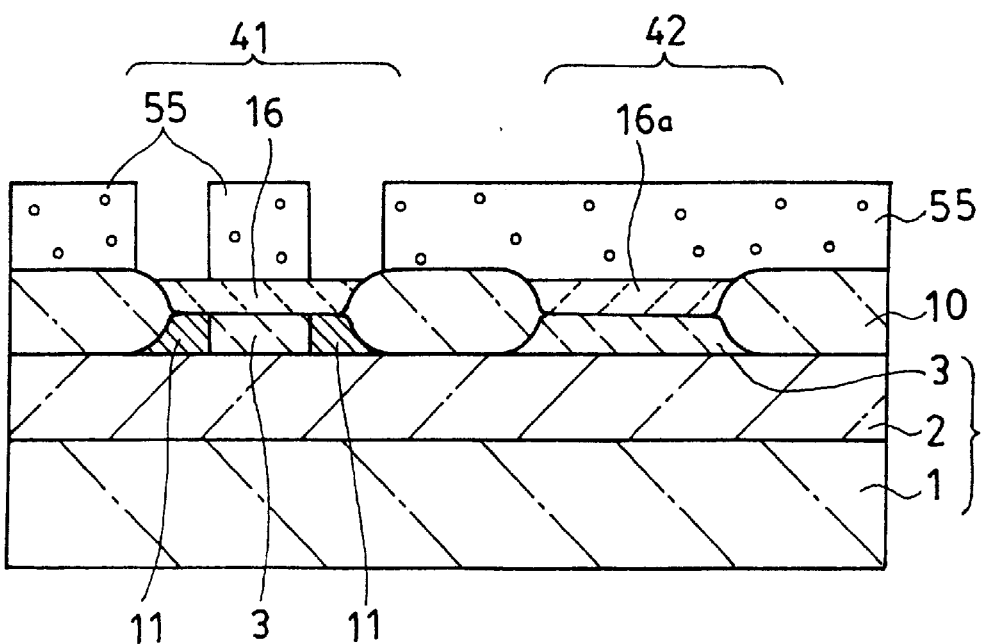

Using the photosensitive resin 55 as a mask for ion implantation, a field doped layer 11 is formed, as shown in FIG. 46, by introducing boron (B), that is a p-type dopant, in the peripheral region of the semiconductor layer 3 for forming an n-channel semiconductor device 41. The dose of boron ions implanted for forming the field dope layer 11 is in the order of $6 \times 10^{13}$ cm$^{-2}$, and ion implantation is carried out at an ion implantation energy of 30 keV. Thereafter, the photosensitive resin 55 is removed.

Figure 47:
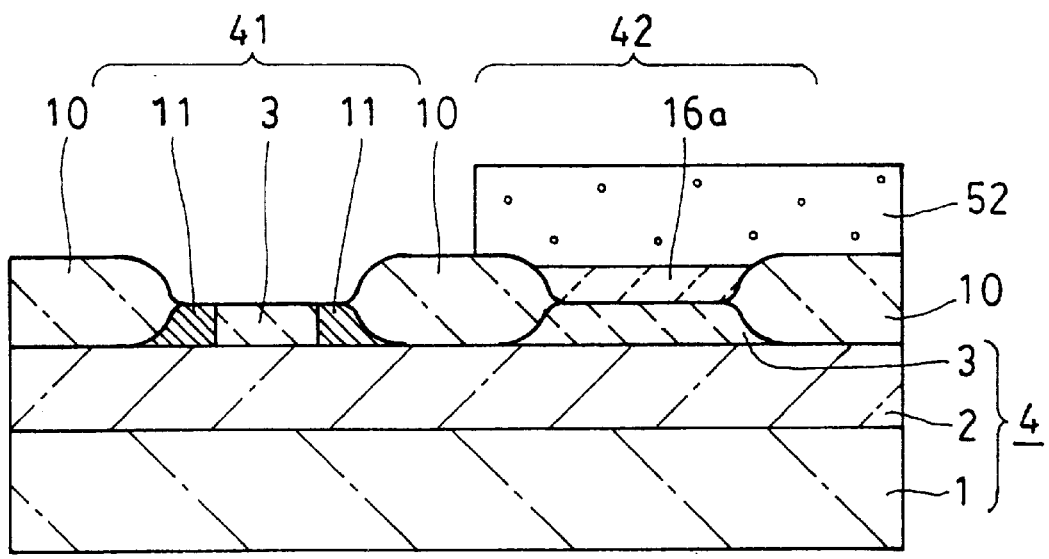

Subsequently, a photosensitive resin is again applied to the entire surface of the SOI substrate by means of the spinner, and a pattern is formed on a photosensitive resin 52 by the photolithographic techniques using a predetermined photo mask such that the photosensitive resin 52 has openings in a region covering the island of the semiconductor layer 3 for the n-channel semiconductor device 41 and the periphery thereof as shown in FIG. 47.

Using the photosensitive resin 52 as an etching mask, the first boundary film 16a formed on the semiconductor layer 3 in a region for the n-channel semiconductor device 41 is removed by the etching process as shown in FIG. 47. The etching process is applied to the first boundary film 16*a* using hydrofluoric acid containing HF. Thereafter, the photosensitive resin 52 is removed.

Figure 48:
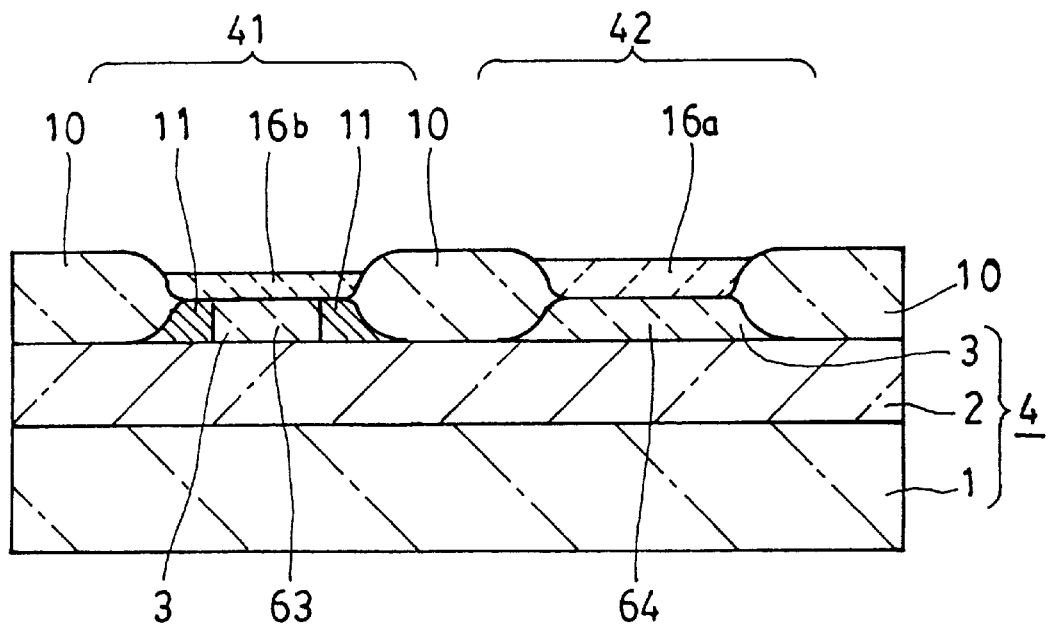

Then, as shown in FIG. 48, a second boundary film 16*b* consisting of silicon oxide is formed to a thickness of 15 nm by oxidizing the semiconductor layer 3 patterned in a plurality of islands on top of the SOI substrate 4. The second boundary film 16*b* is formed by applying an oxidation treatment in an atmosphere of a mixed gas containing oxygen and nitrogen at 1000° C. for 25 minutes. The second boundary film 16*b* is formed on the surface of the semiconductor layer 3 in the region where the n-channel semiconductor device 41 is to be formed, and also slightly on the semiconductor layer 3 in the region where the p-channel semiconductor device 42 is to be formed. However, a resultant increase in the thickness thereof is minimal in this region because of the presence of the first boundary film 16*a*.

The steps of fabrication thereafter are the same as those of Embodiment 3 as described with reference to FIGS. 33 to 39.

What is claimed is:

1. A method of fabricating a MOS device, comprising the steps of:
    forming a semiconductor layer patterned in a plurality of islands for forming an n-channel semiconductor device and a p-channel semiconductor device by forming a photosensitive resin on a surface of the semiconductor layer formed on an SOI substrate consisting of a supporting substrate, an insulation film, and the semiconductor layer, and by etching the semiconductor layer using the photosensitive resin as a mask for etching;
    forming a first boundary film on a surface of respective islands of the semiconductor layer by oxidizing the semiconductor layer in an oxidizing atmosphere;
    removing the first boundary film from the surface of the islands of the semiconductor layer for forming the n-channel semiconductor device by etching;
    forming a second boundary film, thinner in thickness than the first boundary film, on the surface of the island of the semiconductor layer for forming the n-channel semiconductor device by oxidizing the semiconductor layer in an oxidizing atmosphere;
    doping the island of the semiconductor layer for forming the n-channel semiconductor device with a p-type impurity for forming a channel doped layer;
    doping the island of the semiconductor layer for forming the p-channel semiconductor device with an n-type impurity for forming a channel doped layer;
    forming a gate oxide film in a channel forming region of the p-channel semiconductor device and the n-channel semiconductor device by etching the first boundary film and the second boundary film using the photosensitive resin as an etching mask such that the first boundary film and the second boundary film are left intact on a sidewall surface of respective islands of the semiconductor layer, facing boundary regions, and on a part of a top surface thereof, and by oxidizing the semiconductor layer in an oxidizing atmosphere;
    forming a gate electrode for the respective semiconductor devices by forming a gate electrode material on an entire surface of the SOI substrate including the surface of respective islands of the semiconductor layer, and by etching the gate electrode material;
    forming an n-type heavily doped layer in regions for forming a source and a drain of the island of the semiconductor layer for forming the n-channel semiconductor device using a photosensitive resin as a mask for ion implantation;
    forming a p-type heavily doped layer in regions for forming a source and a drain of the island of the semiconductor layer for forming the p-channel semiconductor device using a photosensitive resin as a mask for ion implantation;
    activating impurities contained in the n-type heavily doped layer and the p-type heavily doped layer, by applying thermal treatment;
    forming an interlayer dielectric film consisting mainly of a silicon dioxide film on the entire surface of the SOI substrate;
    forming a plurality of contact holes in the interlayer dielectric film by hot etching; and
    forming interconnections for connection with the gate electrode, the source, and the drain of the n-channel semiconductor device and the p-channel semiconductor device, respectively, through each of the contact holes.

2. A method of fabricating a MOS device according to claim 1, wherein a step of forming a p-type field doped layer more heavily doped than a channel doped layer in the peripheral region of the island of the semiconductor layer for forming the n-channel semiconductor device is interposed between the step of doping the island of the semiconductor layer for forming the p-channel semiconductor device with an n-type impurity for forming the channel doped layer and the step of forming the gate oxide film.

3. A method of fabricating a MOS device, comprising the steps of: forming a silicon nitride film by forming a pad oxide film by oxidizing an entire surface of a semiconductor layer of an SOI substrate consisting of a supporting substrate, an insulation film, and the semiconductor layer, and applying a chemical vapor deposition process to the entire surface of the pad oxide film;
    removing the silicon nitride film by forming a photosensitive resin on the silicon nitride film, and etching the silicon nitride film except in element forming regions using the photosensitive resin as a mask for etching;
    forming the semiconductor layer patterned in a plurality of islands for a p-channel semiconductor device and an n-channel semiconductor device by selective oxidation in an oxidizing atmosphere except where there are said element forming regions;
    forming a first boundary film on a surface of respective islands of the semiconductor layer by removing the silicon nitride film and the pad oxide film, and oxidizing the islands of the semiconductor layer in an oxidizing atmosphere;
    removing the first boundary film from the surface of the islands of the semiconductor layer for forming the n-channel semiconductor device by etching;
    forming a second boundary film, thinner than the first boundary film, on the surface of the island of the semiconductor layer for forming the n-channel semiconductor device by oxidizing the semiconductor layer in an oxidizing atmosphere;
    doping the island of the semiconductor layer for forming the n-channel semiconductor device with a p-type impurity for forming a channel doped layer, using a photosensitive resin film as a mask for ion implantation;
    doping the island of the semiconductor layer for forming the p-channel semiconductor device with an n-type impurity for forming a channel doped layer, using a photosensitive resin as a mask for ion implantation;

forming a gate oxide film in a channel forming region of the p-channel semiconductor device and the n-channel semiconductor device by etching the first boundary film and the second boundary film using a photosensitive resin as an etching mask such that the first boundary film and the second boundary film are left intact on a sidewall surface of respective islands of the semiconductor layer, facing boundary regions, and on a part of a top surface thereof, and oxidizing the first and second boundary films in an oxidizing atmosphere;

forming a gate electrode for the respective semiconductor devices by forming a gate electrode material on the entire surface of the SOI substrate including the surface of respective islands of the semiconductor layer, and etching the gate electrode material;

forming an n-type heavily doped layer in regions for forming a source and a drain of each island of the semiconductor layer for forming the n-channel semiconductor device using a photosensitive resin as a mask for ion implantation;

forming a p-type heavily doped layer in regions for forming a source and a drain of the each island of the semiconductor layer for forming the p-type semiconductor device using a photosensitive resin as a mask for ion implantation;

activating impurities contained in the n-type heavily doped layer and the p-type heavily doped layer by applying thermal treatment;

forming an interlayer dielectric film consisting mainly of a silicon dioxide film on the entire surface of the SOI substrate;

forming a plurality of contact holes in the interlayer dielectric film by hot etching; and forming interconnections for connection with the gate electrode, the source, and the drain of the n-channel semiconductor device and the p-channel semiconductor device, respectively, through each of the contact holes.

4. A method of fabricating a MOS device according to claim 3, wherein a step of forming a p-type field doped layer more heavily doped than a channel doped layer in the peripheral region of the island of the semiconductor layer for forming the n-channel semiconductor device is interposed between the step of doping the island of the semiconductor layer for forming the p-channel semiconductor device with an n-type impurity for forming the channel doped layer, and the step of forming the gate oxide film.

* * * * *